(12) United States Patent
Lee

(10) Patent No.: US 12,310,012 B2
(45) Date of Patent: May 20, 2025

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Ki Hong Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 669 days.

(21) Appl. No.: 17/368,567

(22) Filed: Jul. 6, 2021

(65) Prior Publication Data
US 2022/0216225 A1  Jul. 7, 2022

(30) Foreign Application Priority Data
Jan. 6, 2021 (KR) .................. 10-2021-0001543

(51) Int. Cl.
| | |
|---|---|
| *H10B 41/27* | (2023.01) |
| *G11C 5/06* | (2006.01) |
| *H01L 23/522* | (2006.01) |
| *H01L 23/528* | (2006.01) |
| *H10B 41/10* | (2023.01) |
| *H10B 43/10* | (2023.01) |
| *H10B 43/27* | (2023.01) |

(52) U.S. Cl.
CPC ............ *H10B 41/27* (2023.02); *G11C 5/06* (2013.01); *H01L 23/5226* (2013.01); *H01L 23/5283* (2013.01); *H10B 41/10* (2023.02); *H10B 43/10* (2023.02); *H10B 43/27* (2023.02)

(58) Field of Classification Search
CPC ........ H10B 41/27; H10B 41/10; H10B 43/10; H10B 43/27; H10B 41/50; H10B 43/50; G11C 5/06; H01L 23/5226; H01L 23/5283; H01L 21/76847; H01L 21/76897; H01L 23/5386; H01L 29/401; H01L 29/42324; H01L 29/4234; H01L 29/42356
See application file for complete search history.

(56) References Cited

U.S. PATENT DOCUMENTS

| | | | |
|---|---|---|---|
| 8,729,622 B2 | 5/2014 | Moon et al. | |
| 10,510,590 B2 | 12/2019 | Thombare et al. | |
| 2019/0043880 A1* | 2/2019 | Lee | H10B 43/35 |
| 2022/0052073 A1* | 2/2022 | Kitazawa | H01L 29/40114 |

FOREIGN PATENT DOCUMENTS

KR  1020170111724 A  10/2017

OTHER PUBLICATIONS

M.-A. Nicolet, "Diffusion Barriers in Thin Films," Thin Solid Films, vol. 52, Issue 3, 1978, pp. 415-443. (Year: 1978).*

* cited by examiner

*Primary Examiner* — Benjamin P Sandvik
*Assistant Examiner* — John Patrick Cornely
(74) *Attorney, Agent, or Firm* — WILLIAM PARK & ASSOCIATES LTD.

(57) ABSTRACT

A semiconductor device includes a gate structure including alternately stacked conductive layers and insulating layers, channel structures passing through the gate structure. Each of the conductive layers may include a first portion having a first thickness and a second portion having a second thickness thicker than the first thickness, and the second portion may include a first metal layer, a second metal layer in the first metal layer, and a first barrier layer interposed between the first metal layer and the second metal layer.

15 Claims, 34 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2021-0001543 filed on Jan. 6, 2021, in the Korean Intellectual Property Office, the entire disclosure of which is incorporated by reference herein.

BACKGROUND

1. Technical Field

The present disclosure generally relates to an electronic device, and more particularly, to a semiconductor device and a method of manufacturing the semiconductor device.

2. Related Art

An integration degree of a semiconductor device is mainly determined by an area occupied by a unit memory cell. Recently, as an integration degree of a semiconductor device forming a memory cell in a single layer on a substrate reaches a limit, a three-dimensional semiconductor device in which memory cells are stacked on a substrate is being proposed. In addition, in order to improve operation reliability of the semiconductor device, various structures and manufacturing methods are being developed.

SUMMARY

According to an embodiment of the present disclosure, a semiconductor device may include a gate structure including alternately stacked conductive layers and insulating layers, channel structures passing through the gate structure, and contact plugs respectively connected to the conductive layers. Each of the conductive layers may include a first portion having a first thickness and a second portion having a second thickness thicker than the first thickness, and the second portion may include a first metal layer, a second metal layer in the first metal layer, and a first barrier layer interposed between the first metal layer and the second metal layer.

According to an embodiment of the present disclosure, a semiconductor device may include a gate structure including alternately stacked conductive layers and insulating layers, channel structures passing through the gate structure, and contact plugs respectively connected to the conductive layers. Each of the conductive layers may include a first portion having a first thickness and a second portion having a second thickness thicker than the first thickness, the first portion may include a first metal layer, the second portion includes the first metal layer and a first barrier layer in the first metal layer, and the first barrier layer is spaced apart from the first portion.

According to an embodiment of the present disclosure, a semiconductor device may include a gate structure including alternately stacked conductive layers and insulating layers, the conductive layers being stacked in a step shape; and channel structures passing through the gate structure. Each of the conductive layers may include a first portion having a first thickness and a second portion having a second thickness thicker than the first thickness, and the second portion may include a first metal layer, a second metal layer in the first metal layer, and a first barrier layer interposed between the first metal layer and the second metal layer.

According to an embodiment of the present disclosure, a method of manufacturing a semiconductor device may include forming a stack including alternately stacked sacrificial layers and insulating layers, forming a slit passing through the stack, forming openings including a first portion and a second portion having a thickness greater than that of the first portion, by etching the sacrificial layers through the slit, forming conductive layers including a first metal layer, a second metal layer in the first metal layer, and a first barrier layer interposed between the first metal layer and the second metal layer, in the openings, and forming contact plugs electrically connected to at least one of the first metal layer, the barrier layer, or the second metal layer in the second portion.

BRIEF DESCRIPTION OF THE DRAWINGS

FIGS. 5A, 513, 5C, 5D, and 5E are diagrams illustrating a structure of a semiconductor device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms should not be construed as being limited to the embodiments described in the present specification or application.

An embodiment of the present disclosure provides a semiconductor device having a stable structure and an improved characteristic, and a method of manufacturing the semiconductor device.

An integration degree of a semiconductor device may be improved by stacking memory cells in a three dimension. In addition, a semiconductor device having a stable structure and improved reliability may be provided.

Figure 1A:
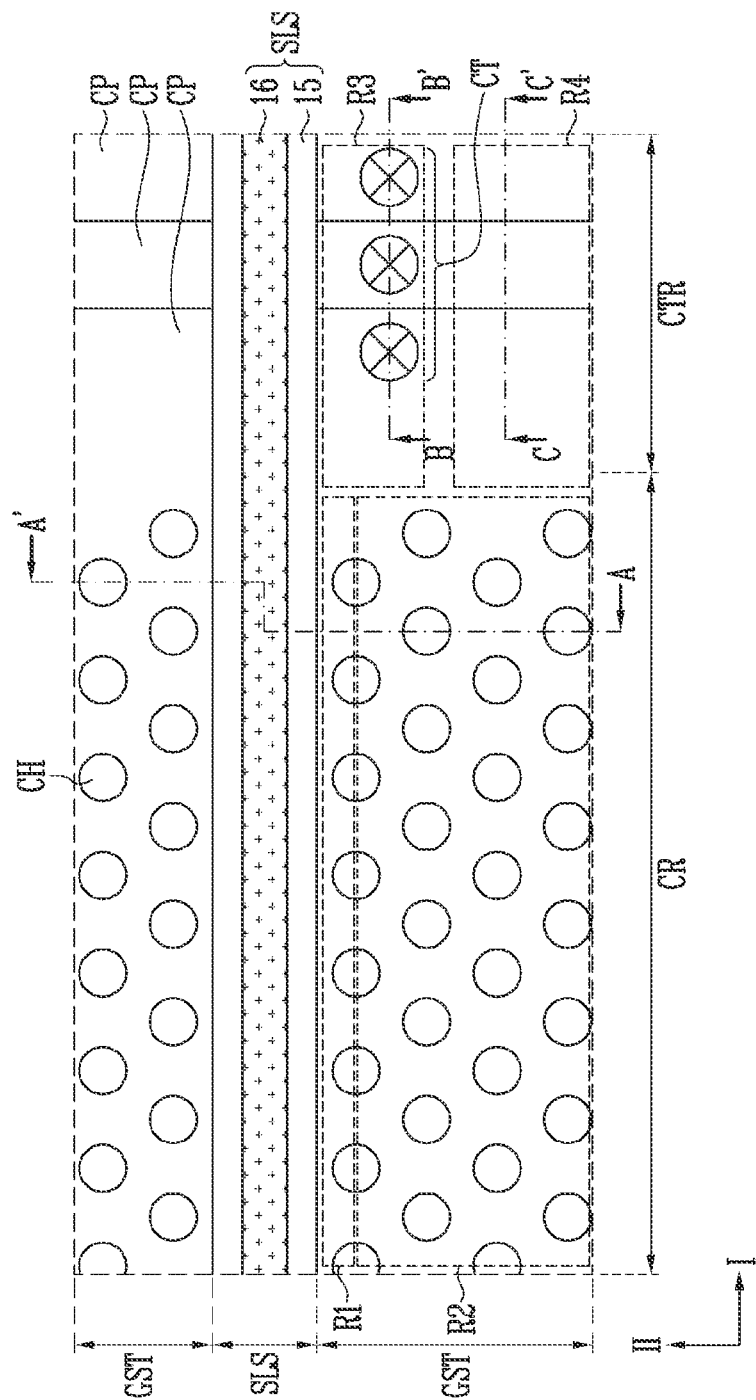
FIGS. 1A, 1B, 1C, 1D, 1E, and 1F are diagrams illustrating a structure of a semiconductor device according to an embodiment of the present disclosure.
Figure 1B:
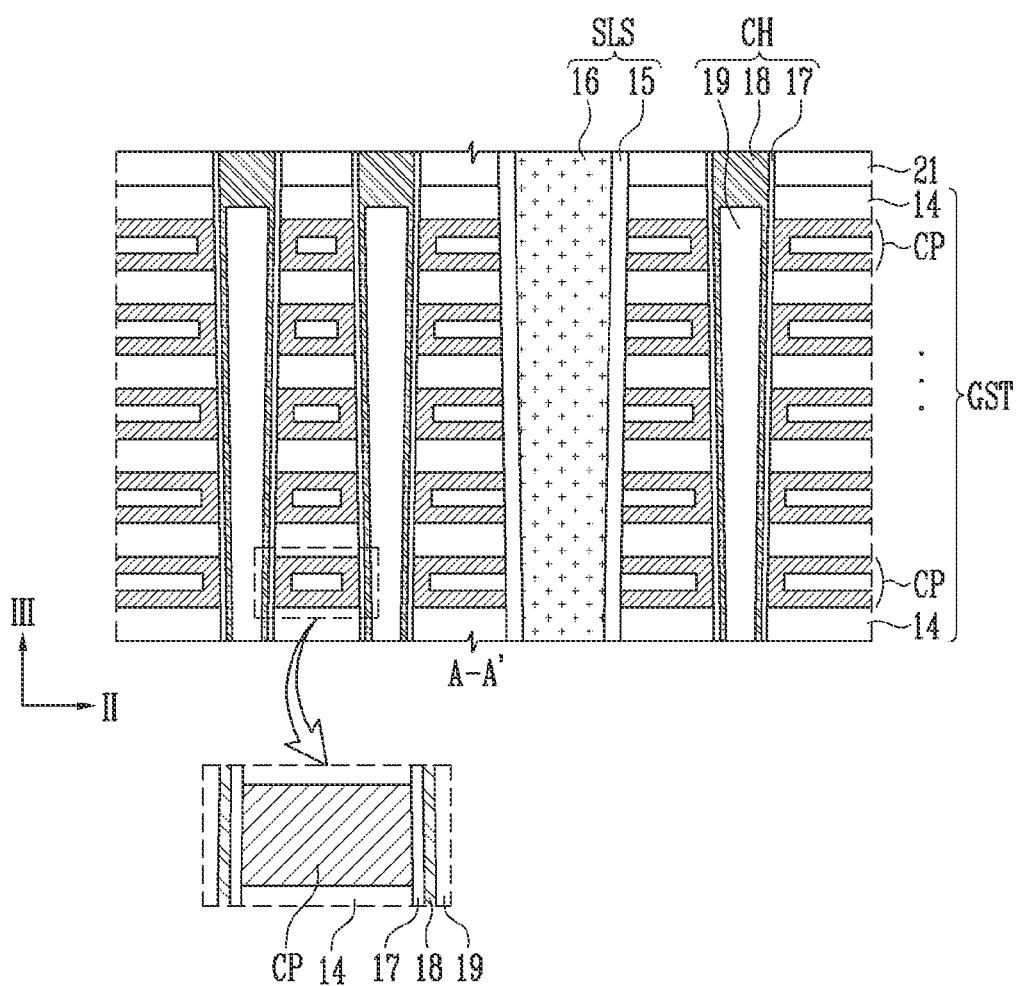
Figure 1C:
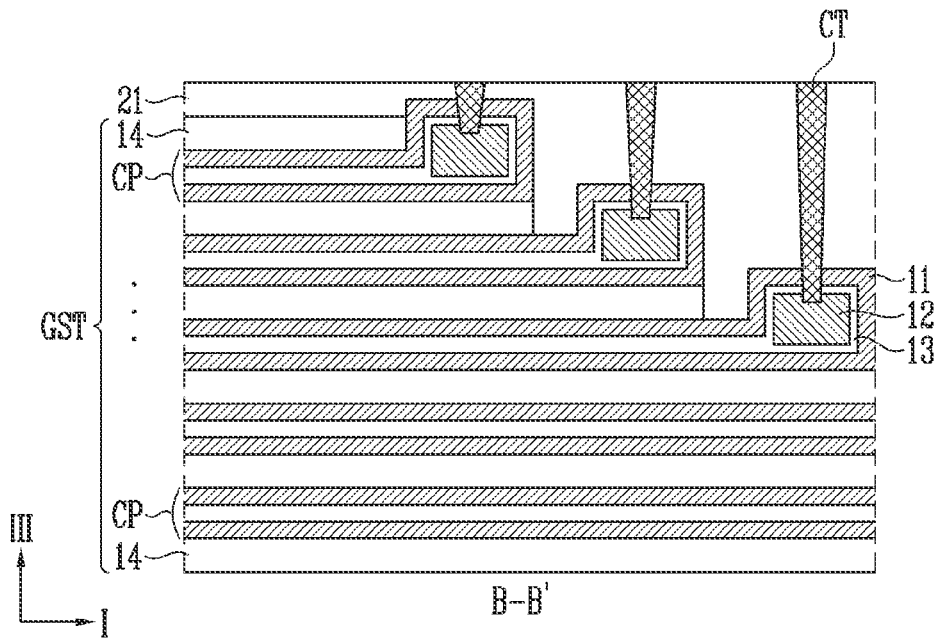
Figure 1D:
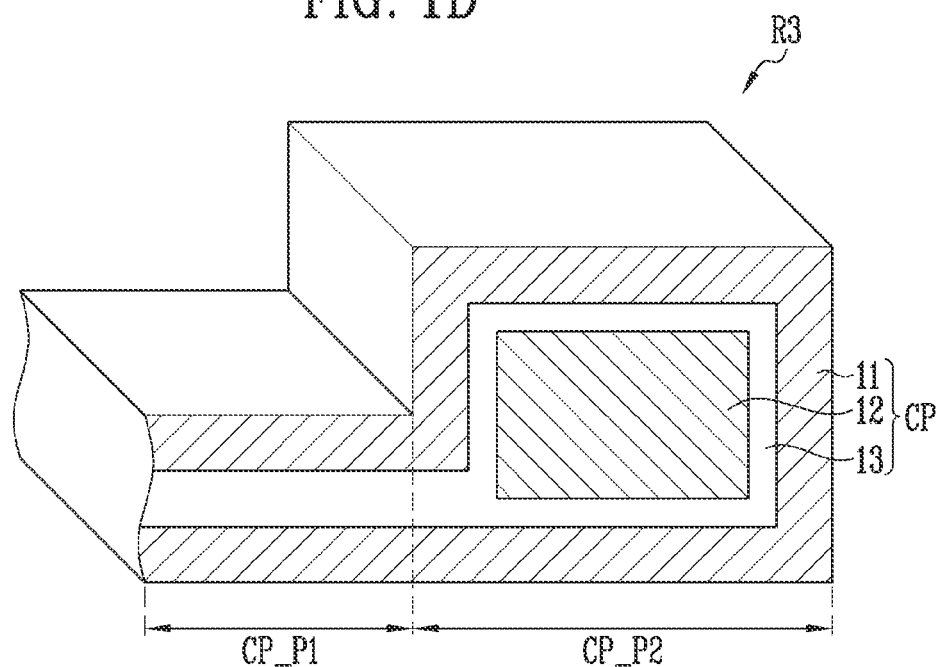
Figure 1E:
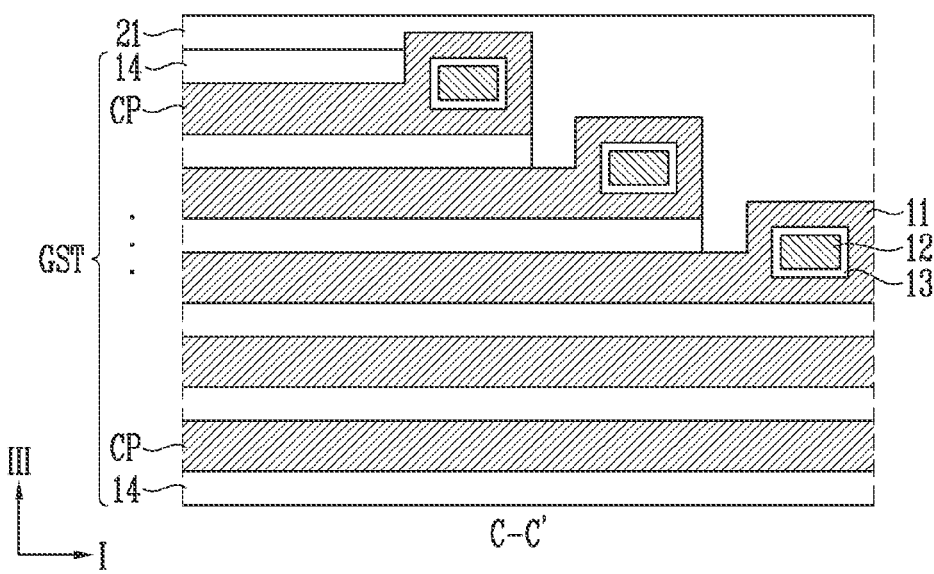
Figure 1F:
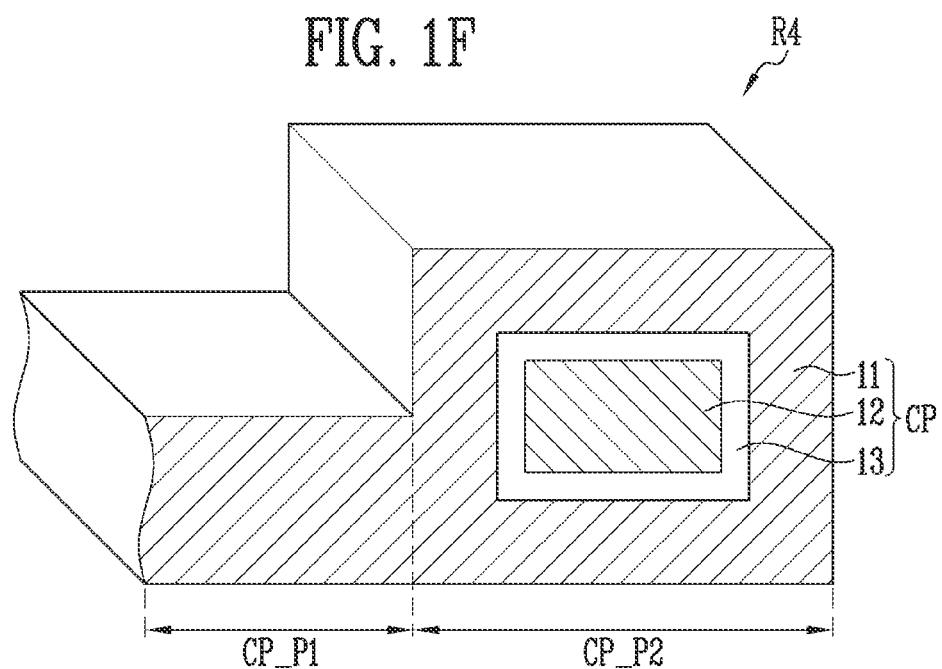

FIGS. 1A to 1F are diagrams illustrating a structure of a semiconductor device according to an embodiment of the present disclosure, FIG. 1A may be a layout, FIG. 13 may be a cross-sectional view taken along a line A-A' of FIG. 1A, FIG. 1C may be a cross-sectional view taken along a line B-B' of FIG. 1A, and FIG. 1D may be a cross-sectional view taken along a line C-C' of FIG. 1A. FIGS. 1D and 1F may be perspective views of a conductive layer CP.

Referring to FIGS. 1A to 1F, the semiconductor device may include a gate structure GST, channel structures CH, and contact plugs CT. In addition, the semiconductor device may further include a slit structure SLS or an interlayer insulating layer 21, or may further include a combination of the slit structure SLS and interlayer insulating layer 21.

The gate structure GST may include conductive layers CP and insulating layers 14 that are alternately stacked. The conductive layers CP may be a gate electrode such as a memory cell and a select transistor. The conductive layers CP may include a conductive material such as polysilicon, tungsten, molybdenum, or metal. The insulating layers 14 are for insulating the stacked conductive layers CP from each other. The insulating layers 14 may include an insulating material such as oxide, nitride, and a gap. In an embodiment the gap may be an air gap or a gap that includes a gas.

The gate structure GST may include a cell region CR and a contact region CTR. Memory strings may be positioned in the cell region CR. The memory strings may include stacked memory cells. An interconnection structure may be positioned in the contact region CTR. The interconnection structure may include a contact plug, a wire, and the like for applying a bias to each of the stacked conductive layers CP. The contact region CTR of the gate structure GST may have a structure exposing each of the conductive layers CP. As an embodiment, the conductive layers CP may be stacked in a step shape, and the contact region CTR of the gate structure GST may have a step shape.

Each of the conductive layers CP may include a first metal layer 11, a second metal layer 12, and a first barrier layer 13. The second metal layer 12 may be positioned in the first metal layer 11. The first metal layer 11 may include a first metal. The second metal layer 12 may include a second metal identical to the first metal, or may include a second metal different from the first metal. The first metal layer 11 and the second metal layer 12 may be formed using the same source gas, or may be formed using different source gases. As an embodiment, the second metal layer 12 may be formed using a fluorine-based source gas. The first metal layer 11 may be formed using a source gas other than fluorine-based source gas. The first metal layer 11 may be formed using a chlorine-based source gas. The second metal layer 12 may have an etching rate lower than that of the first metal layer 11. As an embodiment, the first metal layer 11 may include molybdenum (Mo) and the second metal layer 12 may include tungsten (W).

The first barrier layer 13 may be interposed between the first metal layer 11 and the second metal layer 12. When the first metal layer 11 and the second metal layer 12 include different metals, the first barrier layer 13 may prevent or minimize the first metal layer 11 and the second metal layer 12 from reacting with each other. The first barrier layer 13 may prevent or minimize the insulating layers 14 from being structurally bent. In addition, the first barrier layer 13 may prevent or minimize peripheral layers from being damaged in a manufacturing process. As an embodiment, the first barrier layer 13 may prevent or minimize occurrence of a defect due to a source gas or the like used when forming the second metal layer 12. In a process of depositing the second metal layer 12, the source gas may be prevented or minimized from additionally flowing into the peripheral layer, for example, the first metal layer 11, the insulating layers 14, the memory layer 17, and the like. As an embodiment, when the source gas of the second metal layer 12 remains, damage to the peripheral layer such as the first metal layer 11 due to the remained gas may be prevented or minimized.

The first barrier layer 13 may be entirely formed in the cell region CR or may be formed only in one portion (see FIG. 1E). As an embodiment, the cell region CR may include a first region R1 adjacent to the slit structure SLS and a second region R2 spaced apart from the slit structure SLS. In the first region R1, the conductive layer CP may include the first barrier layer 13. In the second region R2, the conductive layer CP may include or might not include the first barrier layer 13, or may partially include the first barrier layer 13. In the second region R2, the first barrier layer 13 might not be formed between the channel structures CH, and only the first metal layer 11 may be filled or a void may exist between the channel structures CH.

The first barrier layer 13 may be entirely formed in the contact region CTR or may be formed only in one portion of the contact region. As an embodiment, the contact region CTR may include a third region R3 adjacent to the slit structure SLS and a fourth region R4 spaced apart from the slit structure SLS. In the third region R3, the conductive layer CP may include the first barrier layer 13. In the fourth region R4, the conductive layer CP may include or might not include the first barrier layer 13, or may partially include the first barrier layer 13.

The first barrier layer 13 may include an insulating material such as nitride. As an embodiment, the first barrier layer 13 may include silicon nitride. The first barrier layer 13 may include metal oxide, metal nitride, or metal oxynitride, or may include a combination thereof. Here, a metal included in the first barrier layer 13 may be the same as a first metal or a second metal, or may be a third metal different from the first metal and the second metal. As an embodiment, the first barrier layer 13 may include titanium oxide, titanium nitride, titanium oxynitride, tantalum oxide, tantalum nitride, tantalum oxynitride, molybdenum oxide, molybdenum nitride, molybdenum oxynitride, tungsten oxide, tungsten nitride, or tungsten oxynitride, or may include a combination thereof.

For reference, each of the conductive layers CP may further include a second barrier layer (not shown). Each of the conductive layers CP may further include a void (not shown). The void may be positioned between the channel structures CH. The void may be positioned in the first metal layer 11 or the void may be positioned in the first barrier layer 13.

The channel structures CH may pass through the cell region CR of the gate structure GST. The memory cell or the select transistor may be positioned at a portion where the channel structures CH and the conductive layers CP cross. Therefore, the memory cells may be stacked. The channel structures CH may be arranged in a first direction I and a second direction II crossing the first direction I. The channel structures CH may extend in a third direction III. The third direction III may be a direction protruding from a plane defined as the first direction I and the second direction II.

Each of the channel structures CH may include a channel layer 18. The channel structure CH may further include the memory layer 17 or an insulating core 19, or may further include a combination thereof. The channel layer 18 may be a region in which a channel of the memory cell or the select transistor is formed. The channel layer 18 may include a semiconductor material such as silicon, germanium, or nanostructure. The memory layer 17 may be interposed between the channel layer 18 and the conductive layers CP. As an embodiment, the memory layer 17 may be formed to surround a sidewall of the channel layer 18. The memory layer 17 may include a tunnel insulating layer, a data storage layer, or a blocking layer, or may include a combination thereof. The data storage layer may include a floating gate, a charge trap material, polysilicon, nitride, a variable resistance material, a phase change material, or may include a combination thereof. The insulating core 19 may be formed in the channel layer 18. The insulating core 19 may include an insulating material such as oxide, nitride, and air gap.

The contact plugs CT may be electrically connected to the conductive layers CP. The contact plugs CT may be positioned in the contact regions CTR. The contact plugs CT may be respectively connected to second portions CP_P2 of the conductive layers CP. The contact plugs CT may be in contact with at least one of the first metal layer 11, the first barrier layer 13, or the second metal layer 12. As an embodiment, each of the contact plugs CT may pass through the first metal layer and the first barrier layer 13 and may be electrically connected to the second metal layer 12. As an embodiment, each of the contact plugs CT may pass through the second barrier layer 23 (See FIG. 2B), the first metal layer 11, and the first barrier layer 13 and may be electrically connected to the second metal layer 12. A bias may be applied to each of the gate electrodes of the stacked memory cells through the contact plugs CT.

The slit structure SLS may be positioned between the gate structures GST. The slit structure SLS may be positioned between the gate structures GST adjacent in the second direction II, and may extend in the first direction I. As an embodiment, the slit structure SLS may include a source contact structure 16 and an insulating spacer 15 surrounding a sidewall of the source contact structure 16. As an embodiment, the slit structure SLS may include only an insulating material. The slit structure SLS might not include the source contact structure 16 and may include only the insulating spacer 15.

Each of the conductive layers CP may include a first portion CP_P1 and a second portion CP_P2 having a thickness different from that of the first portion CP_P1. In the third direction III, the second portion CP_P2 may have the thickness thicker than that of the first portion CP_P1. The second portion CP_P2 may be positioned in the contact region CTR. The first portion CP_P1 may be positioned in the cell region CR, extend to the contact region CTR, and may be connected to the second portion CP_P2.

In each of the conductive layers CP, a configuration of the first portion CP_P1 and a configuration of the second portion CP_P2 may be different. The conductive layer CP may have a multilayer structure, and the number of layers included in the first portion CP_P1 and the number of layers included in the second portion CP_P2 may be different. The number of layers included in the second portion CP_P2 may be greater than the number of layers included in the first portion CP_P1. A material included in the first portion CP_P1 and a material included in the second portion CP_P2 may be different. The second portion CP_P2 may include a material having a relatively low etching rate.

Each of the conductive layers CP may have the same structure or different structures in the third region R3 and the fourth region R4. FIGS. 1C and 1D may be related to a structure of the third region R3. Referring to FIGS. 1A, 1C, and 1D, in the third region R3, each of the conductive layers CP may include a first portion CP_P1 and a second portion CP_P2. In the third region R3, the conductive layer CP may include the first barrier layer 13. As an embodiment, in the third region R3, the first barrier layer 13 may be included in the first portion CP_P1 and the second portion CP_P2 of the conductive layer CP. Therefore, the second portion CP_P2 may include the first metal layer 11, the second metal layer 12, and the first barrier layer 13. As an embodiment, the first portion CP_P1 may include the first metal layer 11 and the first barrier layer 13. The first metal layer 11 of the first portion CP_P1 and the first metal layer 11 of the second portion CP_P2 may be a single layer connected to each other. The first barrier layer 13 of the first portion CP_P1 and the first barrier layer 13 of the second portion CP_P2 may be a single layer connected to each other. The second metal layer 12 may be spaced apart from the first portion CP_P1. In other words, the first portion CP_P1 might not include the second metal layer 12.

FIGS. 1E and 1F may be a structure of the fourth region R4. Referring to FIGS. 1A, 1E, and 1F, each of the conductive layers CP may include the first portion CP_P1 and the second portion CP_P2 in the fourth region R4. In the fourth region R4, the conductive layer CP may include or might not include the first barrier layer 13, or may partially include the first barrier layer 13. As an embodiment, in the fourth region R4, a first portion CP_1 of the conductive layer CP might not include the first barrier layer 13, and a second portion CP_P2 may include the first barrier layer 13. Therefore, the second portion CP_P2 may include the first metal layer 11, the second metal layer 12, and the first barrier layer 13. The first portion CP_P1 may include the first metal layer 11. The first metal layer 11 of the first portion CP_P1 and the first metal layer 11 of the second portion CP_P2 may be a single layer connected to each other. The second metal layer 12 and the first barrier layer 13 may be spaced apart from the first part CP_P1. In other words, the first part CP_P1 might not include the second metal layer 12 and the first barrier layer 13.

According to the structure as described above, each of the conductive layers CP may include the first portion CP_P1 and the second portion CP_P2 having different thicknesses. The conductive layer CP may include the second metal layer 12 only in the second portion CP_P2.

Figure 2A:
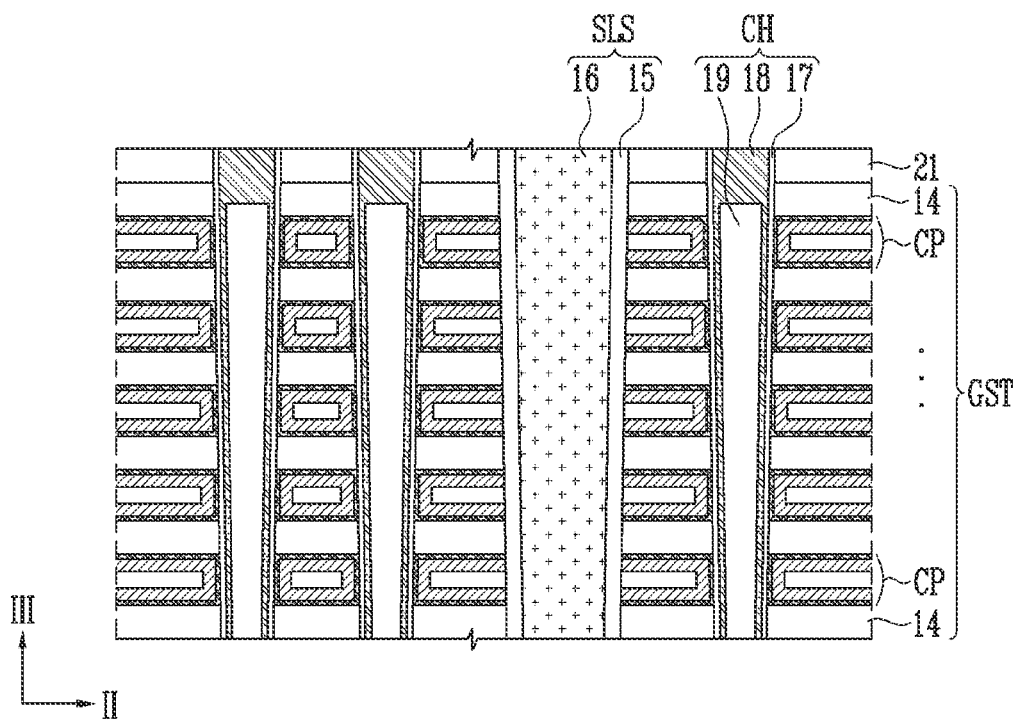
FIGS. 2A, 2B, 2C, 2D, and 2E are diagrams illustrating a structure of a semiconductor device according to an embodiment of the present disclosure.

FIGS. 2A to 2E are diagrams illustrating a structure of a semiconductor device according to an embodiment. FIG. 2A may be a cross-sectional view of a cell region, FIGS. 2B and 2D may be cross-sectional views of a contact region, and FIGS. 2C and 2E may be perspective views of a conductive layer CP. Hereinafter, contents repetitive to the previously described contents are omitted.

Referring to FIGS. 2A to 2E, the semiconductor device may include a gate structure GST, channel structures CH, and contact plugs CT. The gate structure GST may include conductive layers CP and insulating layers 14 that are alternately stacked.

Each of the conductive layers CP may include a first metal layer 11, a second metal layer 12, a first barrier layer 13, and a second barrier layer 23. The second metal layer 12 may be positioned in the first metal layer 11. The first metal layer 11 may include a first metal. The second metal layer 12 may include a second metal identical to the first metal, or may include a second metal different from the first metal.

The second barrier layer 23 may be formed to surround the first metal layer 11. The second barrier layer 23 may be interposed between the first metal layer 11 and the insulating layers 14. The second barrier layer 23 may be interposed between the first metal layer 11 and a memory layer 17. The second barrier layer 23 may be interposed between the first metal layer 11 and an interlayer insulating layer 21. The second barrier layer 23 may include the same material as the first barrier layer 13 or may include a material different from that of the first barrier layer 13.

The second barrier layer 23 may include an insulating material such as nitride. As an embodiment, the second barrier layer 23 may include silicon nitride. The second barrier layer 23 may include metal oxide, metal nitride, or metal oxynitride, or may include a combination thereof. Here, the metal included in the second barrier layer 23 may be the same as the first metal or the second metal, or may be a third metal different from the first metal and the second metal. As an embodiment, the second barrier layer 23 may include titanium oxide, titanium nitride, titanium oxynitride, tantalum oxide, tantalum nitride, tantalum oxynitride, molybdenum oxide, molybdenum nitride, molybdenum oxynitride, tungsten oxide, tungsten nitride, or tungsten oxynitride, or may include a combination thereof.

Each of the conductive layers CP may include a first portion CP_P1 and a second portion CP_P2. Each of the conductive layers CP may include a portion adjacent to the slit structure SLS and a portion spaced apart from the slit structure SLS, and the portion adjacent to the slit structure SLS and the portion spaced apart from the slit structure SLS may have the same structure or may have different structures.

Figure 2B:
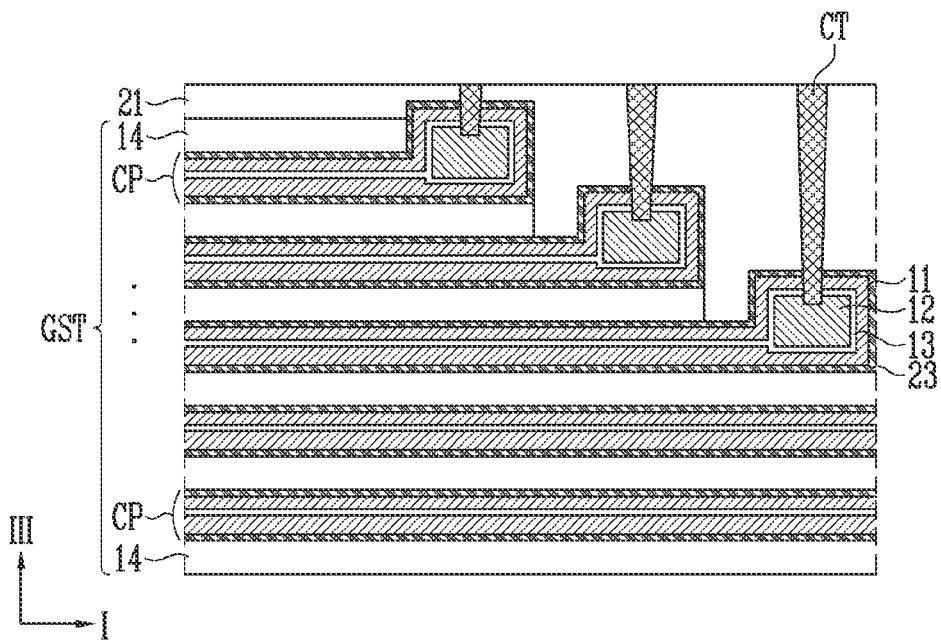
Figure 2C:
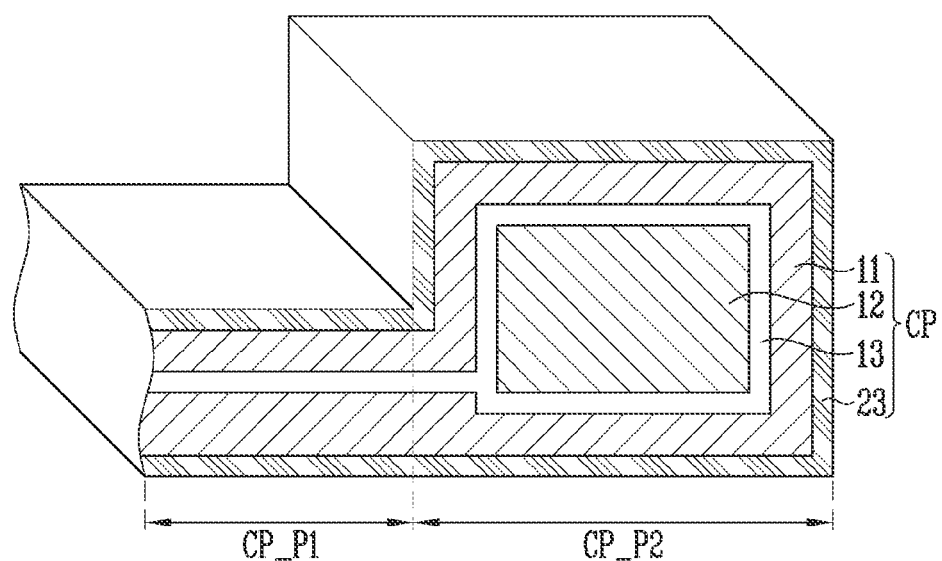

FIGS. 2B and 2C may relate to a structure of the portion adjacent to the slit structure SLS. Referring to FIGS. 2B and 2C, the second portion CP_P2 may include a first metal layer 11, a second metal layer 12, a first barrier layer 13, and a second barrier layer 23. The first portion CP_P1 may include the first metal layer 11, the first barrier layer 13, and the second barrier layer 23. The second barrier layer 23 of the first portion CP_P1 and the second barrier layer 23 of the second portion CP_P2 may be a single layer connected to each other.

Figure 2D:
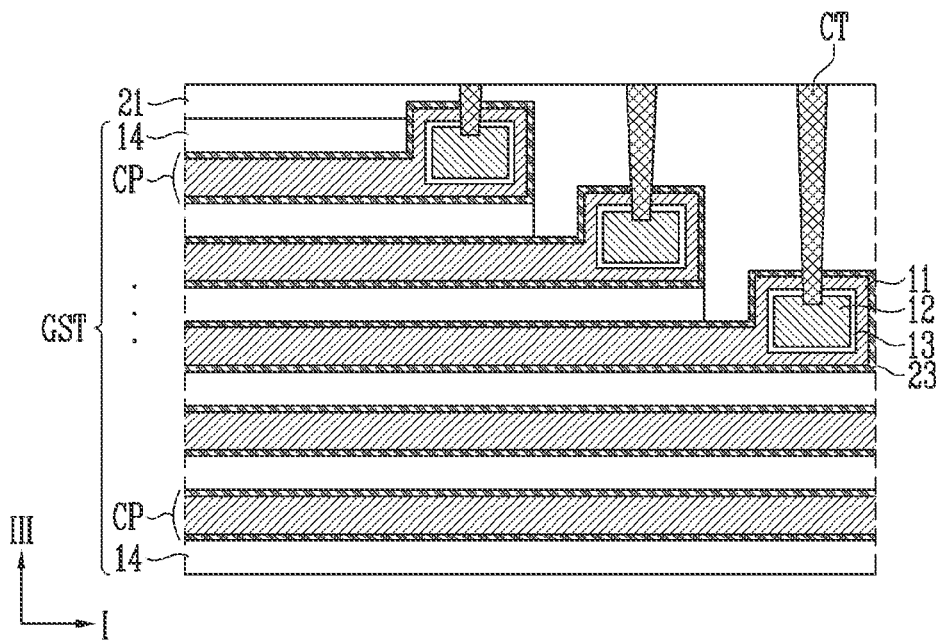
Figure 2E:
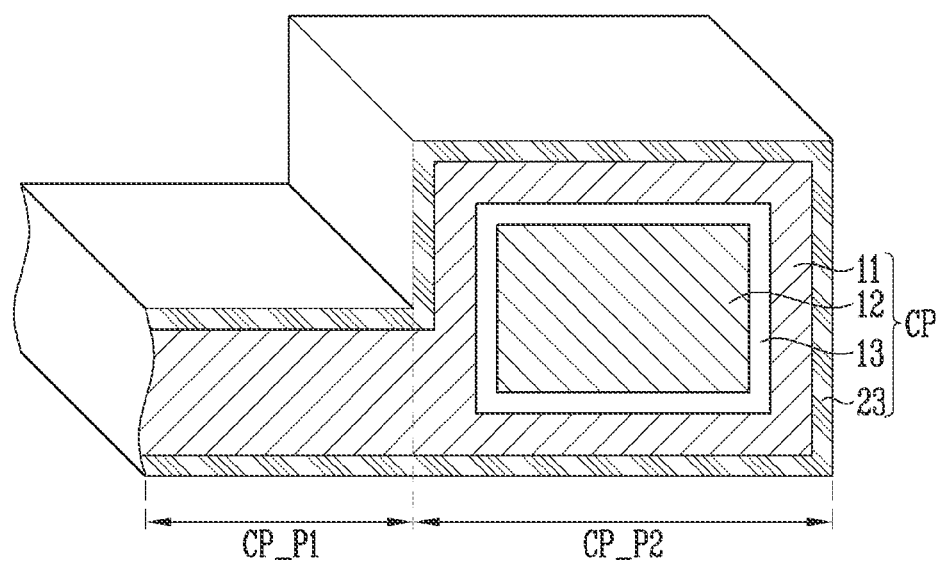

FIGS. 2D and 2E may relate to a structure of the portion spaced apart from the slit structure SLS. Referring to FIGS. 2D and 2E, the second portion CP_P2 may include the first metal layer 11, the second metal layer 12, the first barrier layer 13, and the second barrier layer 23. The first portion CP_P1 may include the first metal layer 11 and the second barrier layer 23. The second barrier layer 23 of the first portion CP_P1 and the second barrier layer 23 of the second portion CP_P2 may be a single layer connected to each other.

According to the structure as described above, each of the conductive layers CP may include the first portion CP_P1 and the second portion CP_P2 having different thicknesses. The conductive layer CP may include the second barrier layer 23 in the first portion CP_P1 and the second portion CP_P2. The second barrier layer 23 may include the same material as the first barrier layer 13 or may include a material different from that of the first barrier layer 13.

Figure 3A:
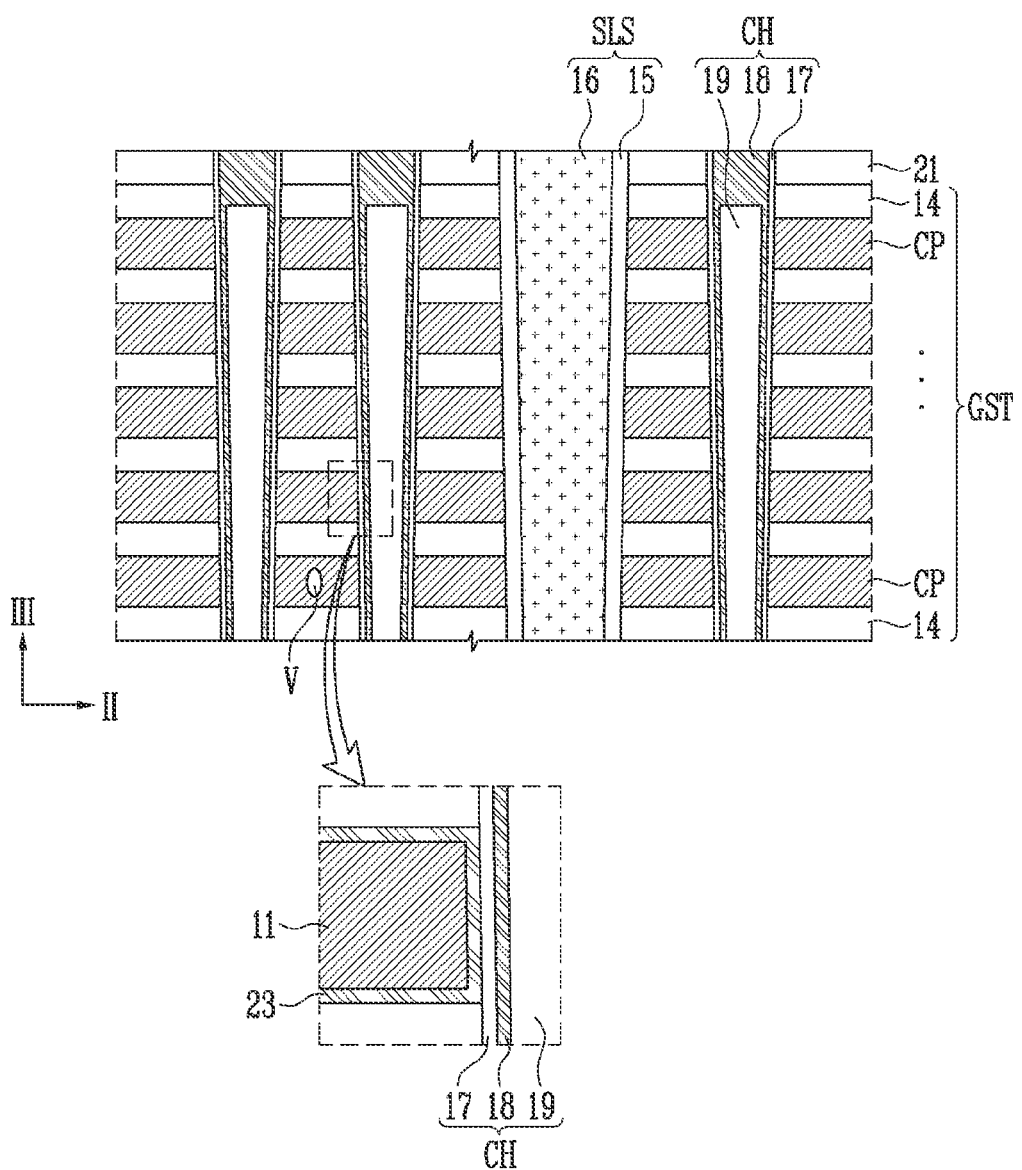
FIGS. 3A, 3B, and 3C are diagrams illustrating a structure of a semiconductor device according to an embodiment of the present disclosure.
Figure 3B:
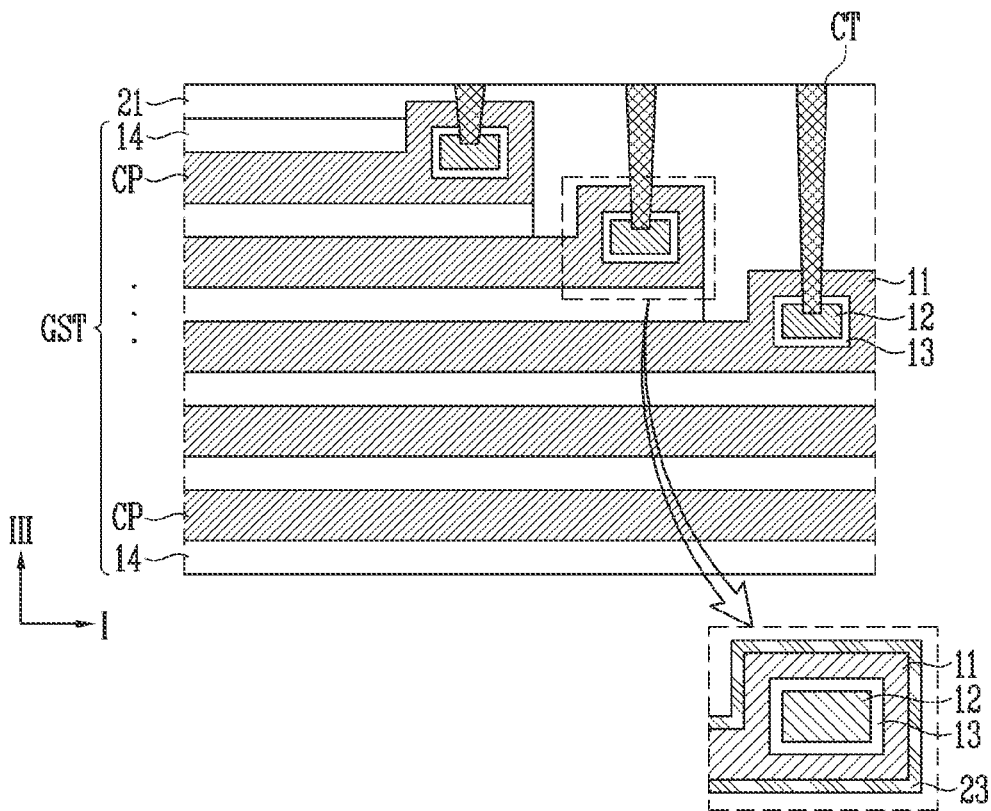
Figure 3C:
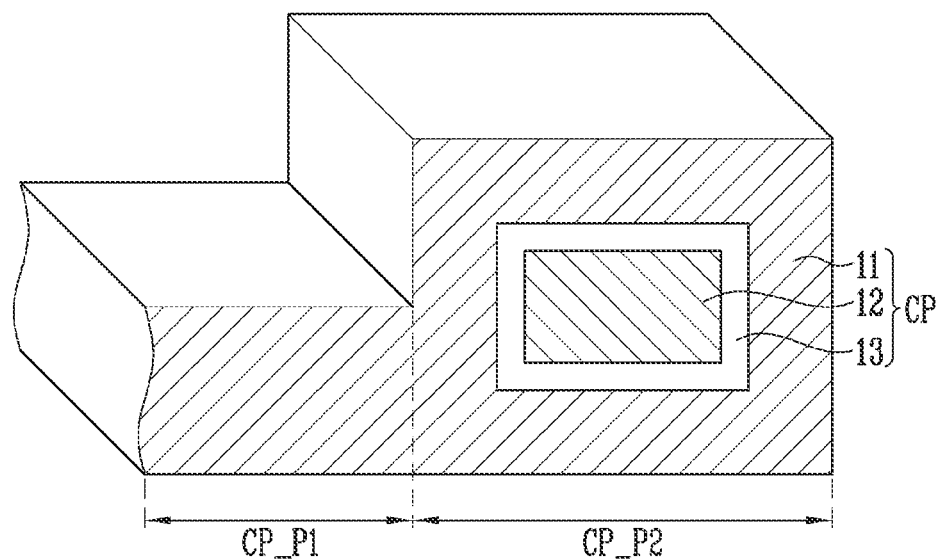

FIGS. 3A to 3C are diagrams illustrating a structure of a semiconductor device according to an embodiment of the present disclosure. FIG. 3A may be a cross-sectional view of a cell region, FIG. 3B may be a cross-sectional view of a contact region, and FIG. 3C may be a perspective view of a conductive layer CP. Hereinafter, contents repetitive to the previously described contents are omitted.

Referring to FIGS. 3A and 3B, the semiconductor device may include a gate structure GST, channel structures CH, and contact plugs CT. The gate structure GST may include conductive layers CP and insulating layers 14 that are alternately stacked. At least one conductive layer CP among the conductive layers CP may include a void V positioned between the channel structures CH.

Referring to FIG. 3C, each of the conductive layers CP may include a first portion CP_P1 and a second portion CP_P2. As an embodiment, the second portion CP_P2 may include a first metal layer 11, a second metal layer 12, and a first barrier layer 13, and the first portion CP_P1 may include the first metal layer 11. The first barrier layer 13 and the second metal layer 12 may be spaced apart from the first portion CP_P1. In other words, the first portion CP_P1 might not include the first barrier layer 13 and the second metal layer 12.

For reference, each of the conductive layers CP may further include a second barrier layer 23. The second barrier layer 23 may be formed to surround the first metal layer 11. As an embodiment, the second portion CP_P2 may include the second barrier layer 23, the first metal layer 11, the second metal layer 12, and the first barrier layer 13, and the first portion CP_P1 may include the second barrier layer 23 and the first metal layer 11.

According to the structure as described above, each of the conductive layers CP may include the first portion CP_P1 and the second portion CP_P2 having different thicknesses. The conductive layer CP may include the first barrier layer 13 and the second metal layer 12 only in the second portion CP_P2.

Figure 4A:
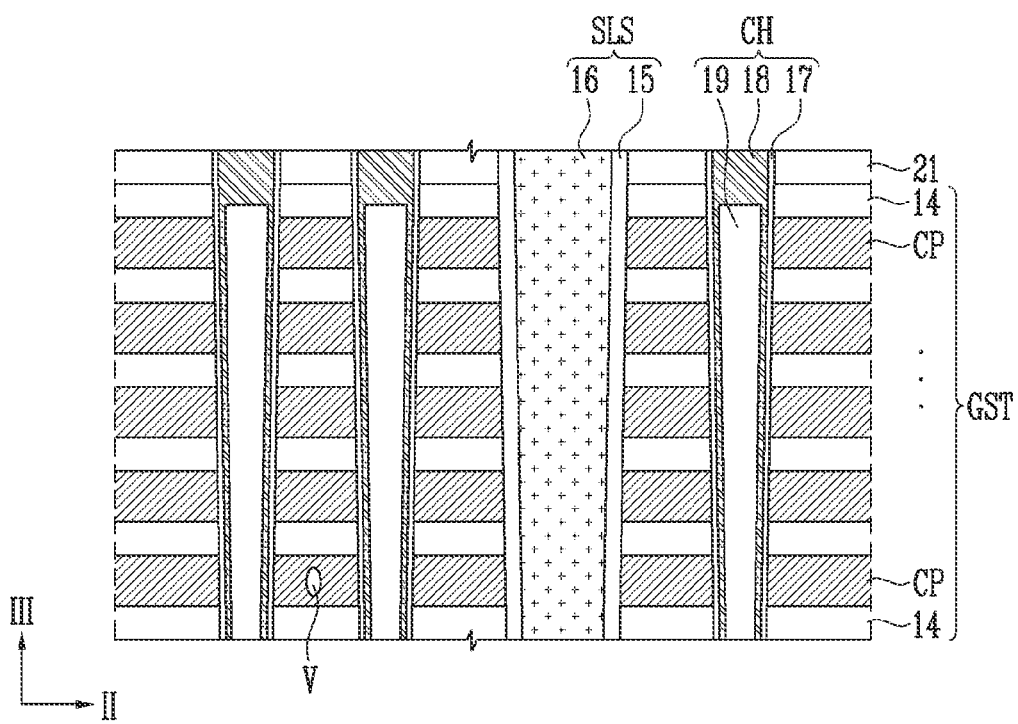
FIGS. 4A, 4B, 4C, 4D, and 4E are diagrams illustrating a structure of a semiconductor device according to an embodiment of the present disclosure.
Figure 4B:
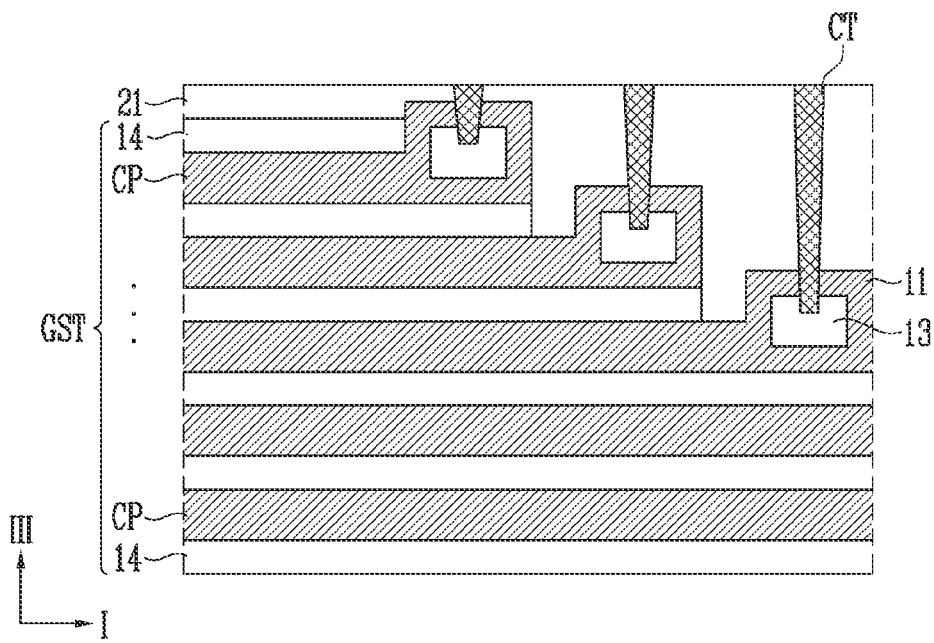
Figure 4C:
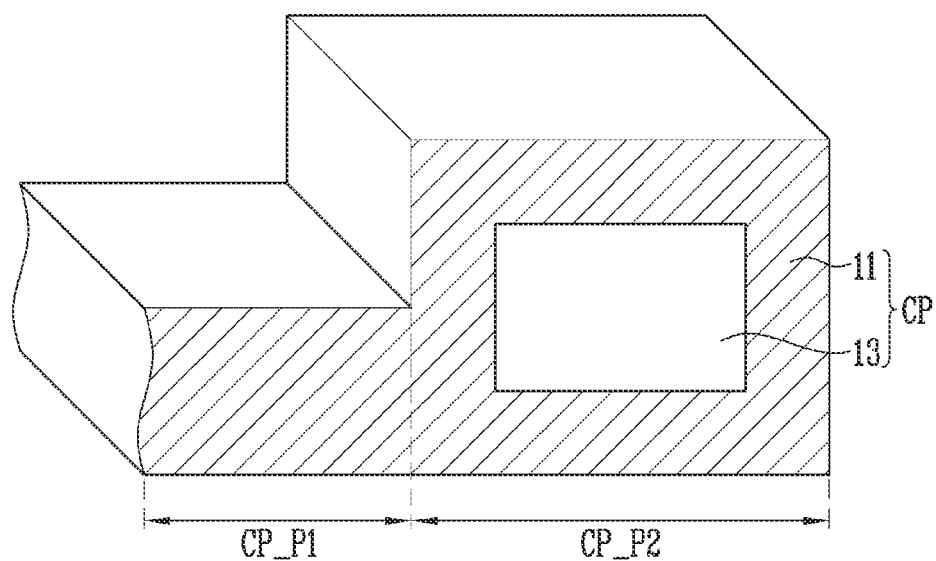

FIGS. 4A to 4C are diagrams illustrating a structure of a semiconductor device according to an embodiment of the present disclosure. FIG. 4A may be a cross-sectional view of a cell region, FIGS. 4B and 4D may be cross-sectional views of a contact region, and FIGS. 4C and 4E may be perspective views of a conductive layer CP. Hereinafter, contents repetitive to the previously described contents are omitted.

Referring to FIGS. 4A to 4E, the semiconductor device may include a gate structure GST, channel structures CH, and contact plugs CT. The gate structure GST may include conductive layers CP and insulating layers 14 that are alternately stacked. At least one conductive layer CP among the conductive layers CP may include a void V positioned between the channel structures CH.

Each of the conductive layers CP may include a first portion CP_P1 and a second portion CP_P2. Each of the conductive layers CP may include a portion adjacent to the slit structure SLS and a portion spaced apart from the slit structure SLS, and the portion adjacent to the slit structure SLS and the portion spaced apart from the slit structure SLS may have the same structure or different structures.

FIGS. 4B and 4C may be related to a structure of the portion spaced apart from the slit structure SLS. Referring to FIGS. 4B and 4C, the second portion CP_P2 may include a first metal layer 11 and a first barrier layer 13, and the first portion CP_P1 may include the first metal layer 11. The first barrier layer 13 may be spaced apart from the first portion CP_P1. In other words, the first portion CP_P1 might not include the first barrier layer 13.

Figure 4D:
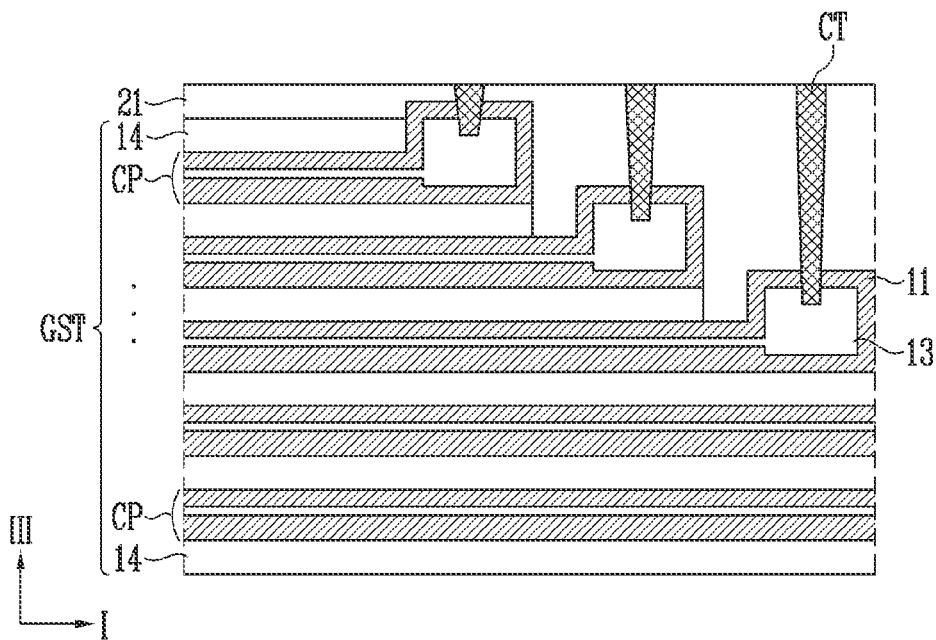
Figure 4E:
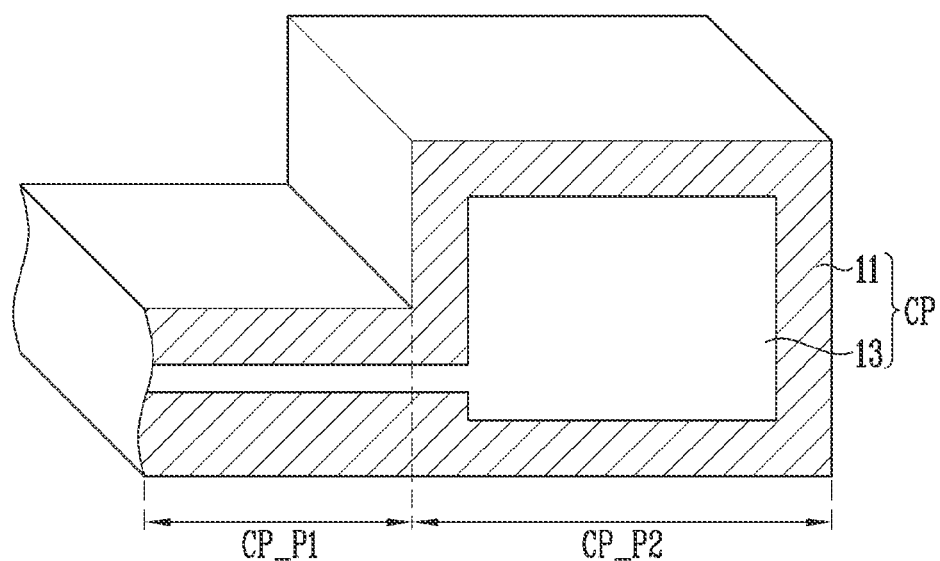

FIGS. 4D and 4E may relate to a structure of the portion adjacent to the slit structure SLS. Referring to FIGS. 4D and 4E, the second portion CP_P2 may include a first metal layer 11 and a first barrier layer 13, and the first portion CP_P1 may include the first metal layer 11 and a first barrier layer 13.

According to the structure as described above, each of the conductive layers CP may include the first portion CP_P1 and the second portion CP_P2 having different thicknesses. In the portion of the contact region spaced apart from the slit structure SLS, the conductive layer CP may include the first barrier layer 13 only in the second portion CP_P2.

Figure 5A:
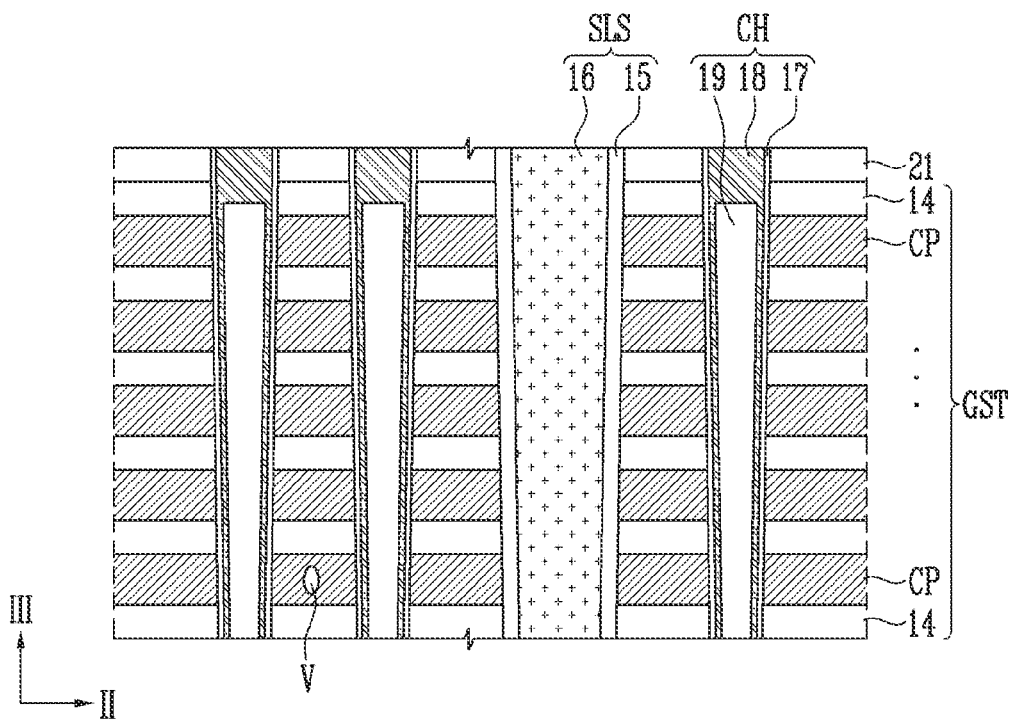

FIGS. 5A to 5E are diagrams illustrating a structure of a semiconductor device according to an embodiment of the present disclosure. FIG. 5A may be a cross-sectional view of a cell region, FIGS. 5B and 5D may be cross-sectional views of a contact region, and FIGS. 5C and 5E may be perspective views of a conductive layer CP. Hereinafter, contents repetitive to the previously described contents are omitted.

Referring to FIGS. 5A to 5E, the semiconductor device may include a gate structure GST, channel structures CH, and contact plugs CT. The gate structure GST may include conductive layers CP and insulating layers 14 that are alternately stacked. At least one conductive layer CP among the conductive layers CP may include a void V positioned between the channel structures CH.

Each of the conductive layers CP may include a first portion CP_P1 and a second portion CP_P2. Each of the conductive layers CP may include a portion adjacent to the slit structure SLS and a portion spaced apart from the slit structure SLS, and the portion adjacent to the slit structure SLS and the portion spaced apart from the slit structure SLS may have the same structure or different structures.

Figure 5B:
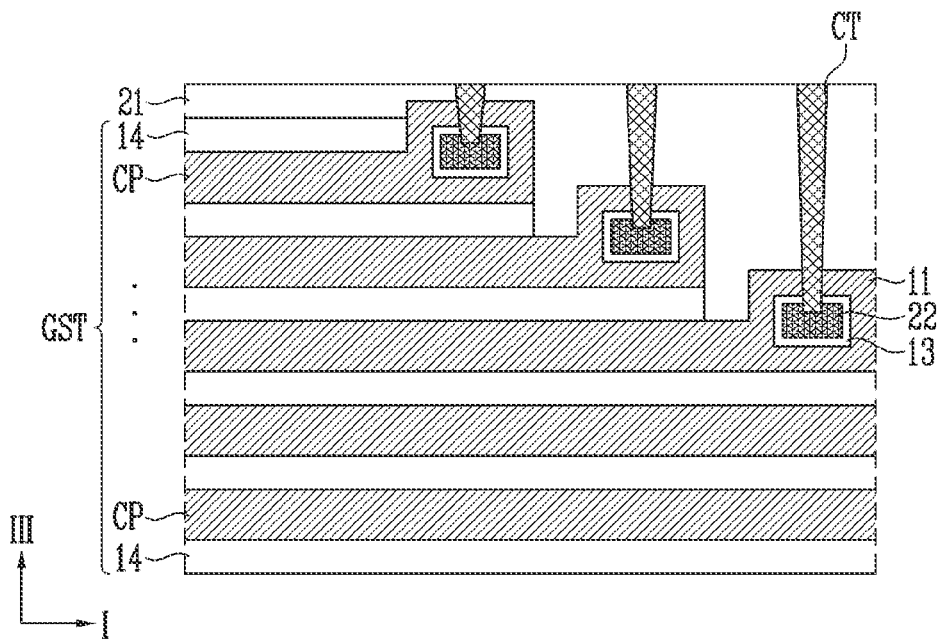
Figure 5C:
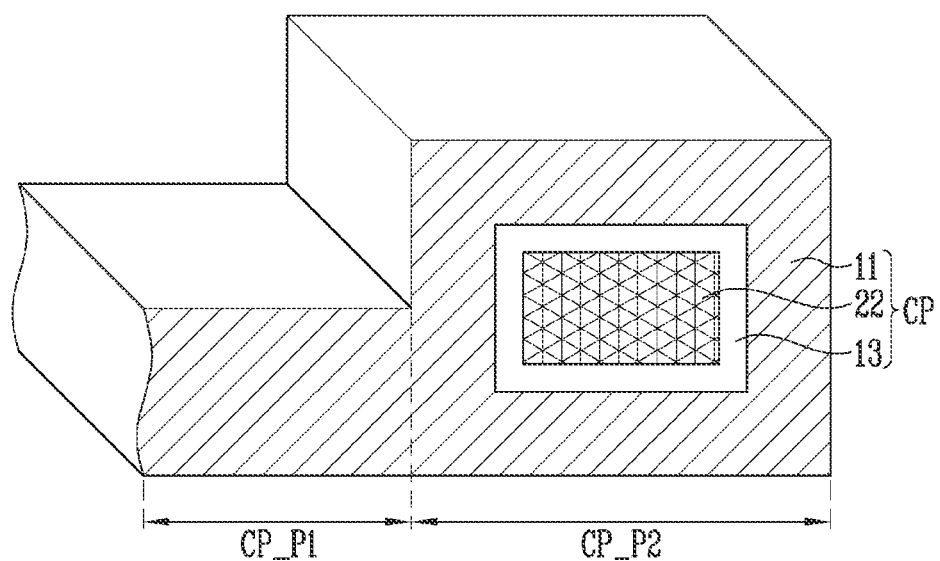

FIGS. 5B and 5C may be related to a structure of the portion spaced apart from the slit structure SLS. Referring to FIGS. 5B and 5C, the second portion CP_P2 may include a first metal layer 11, a first barrier layer 13, and a gap fill layer 22, and the first portion CP_P1 may include the first metal layer 11. The first barrier layer 13 and the gap fill layer 22 may be spaced apart from the first portion CP_P1. In other words, the first portion CP_P1 might not include the first barrier layer 13 and the gap fill layer 22.

Figure 5D:
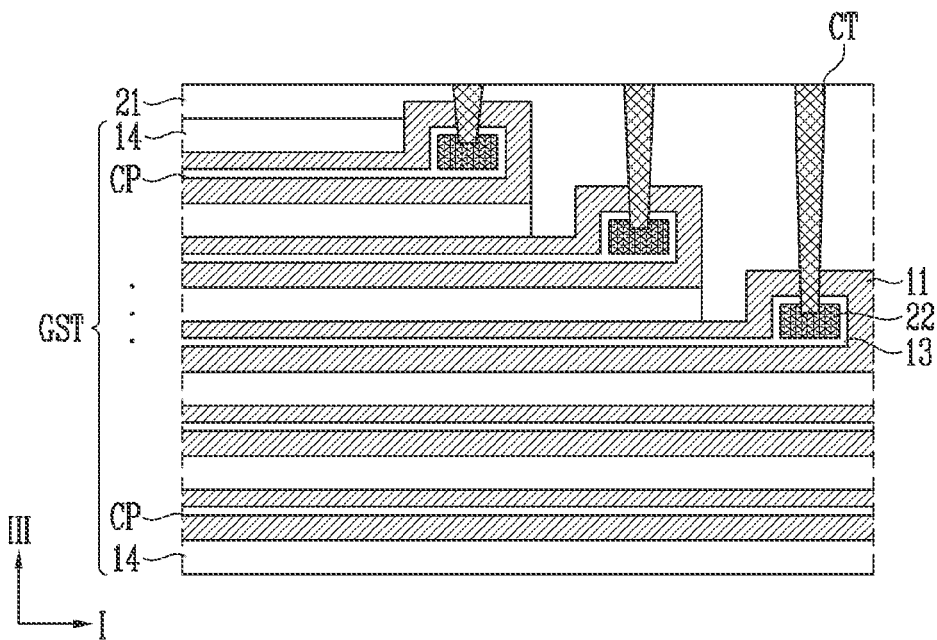
Figure 5E:
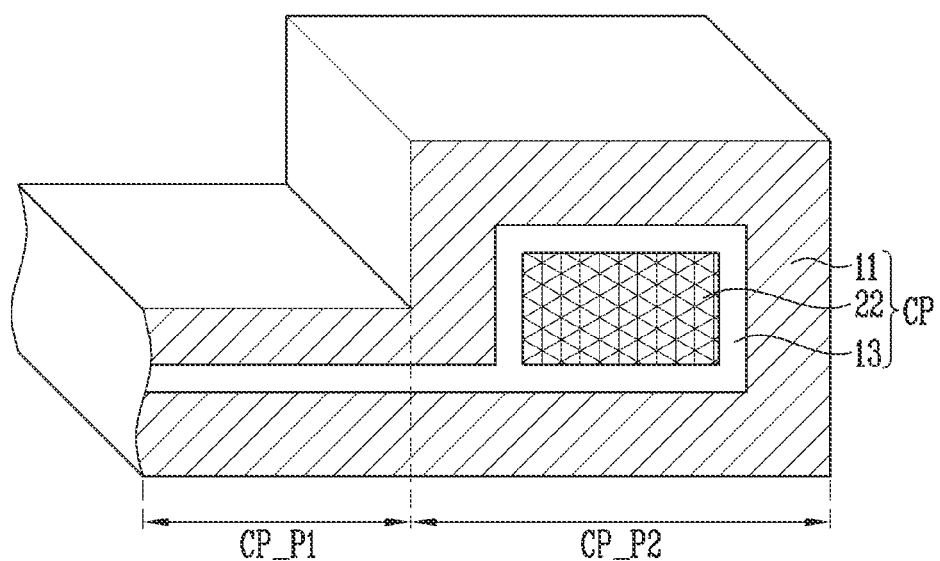

FIGS. 5D and 5E may be related to a structure of the portion adjacent to the slit structure SLS. Referring to FIGS. 5D and 5E, the second portion CP_P2 may include the first metal layer 11, the first barrier layer 13, and the gap fill layer 22, and the first portion CP_P1 may include the first metal layer 11 and the first barrier layer 13. The gap fill layer 22 may be spaced apart from the first portion CP_P1. In other words, the first portion CP_P1 might not include the gap fill layer 22.

The gap fill layer 22 may include a conductor, a semiconductor material, or a dielectric material, or may include a combination thereof. The conductor may include a conductive material such as metal or polysilicon. When the conductor includes a metal, the conductor may include a metal identical to or different from that of the first metal layer 11.

According to the structure as described above, each of the conductive layers CP may include the first portion CP_P1 and the second portion CP_P2 having different thicknesses. In the portion of the contact region spaced from the slit structure SLS, the conductive layer CP may include the first barrier layer 13 and the gap fill layer 22 only in the second portion CP_P2.

FIGS. 6A to 10A and 6B to 10B are diagrams illustrating a method of manufacturing a semiconductor device according to an embodiment of the present disclosure. FIG. A of each number may be a cross-sectional view of the cell region CR, and FIG. B of each number may be a cross-sectional view of the contact region CTR. Hereinafter, contents repetitive to the previously described contents are omitted.

Figure 6A:
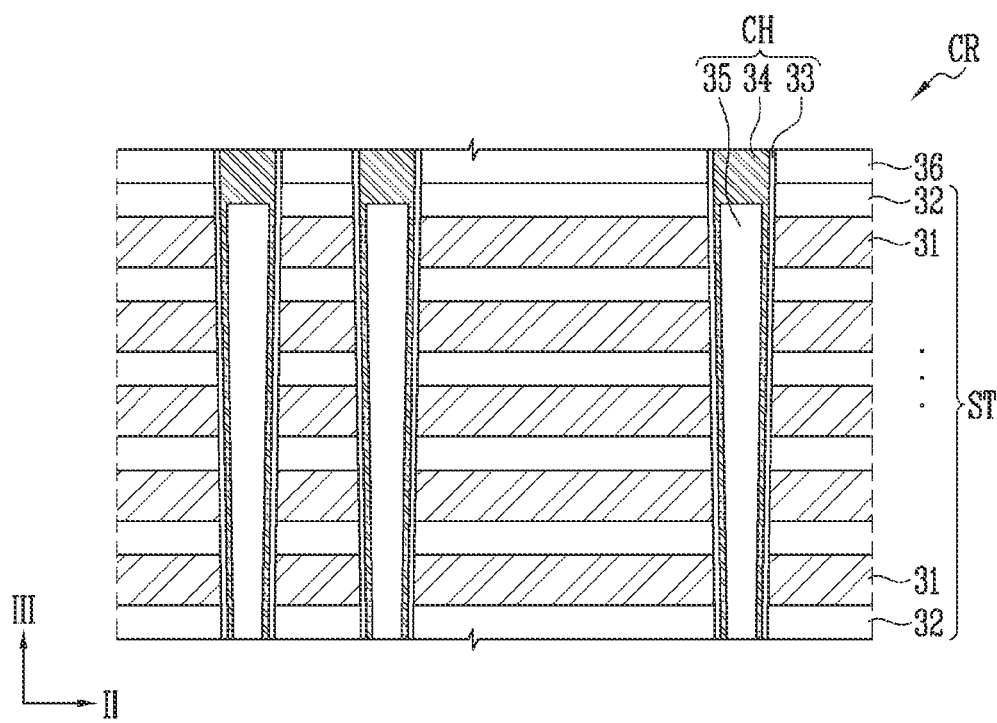
FIGS. 6A, 6B, 7A, 7B, 8A, 8B, 9A, 9B, 10A, and 10B are diagrams illustrating a method of manufacturing a semiconductor device according to an embodiment of the present disclosure.
Figure 6B:
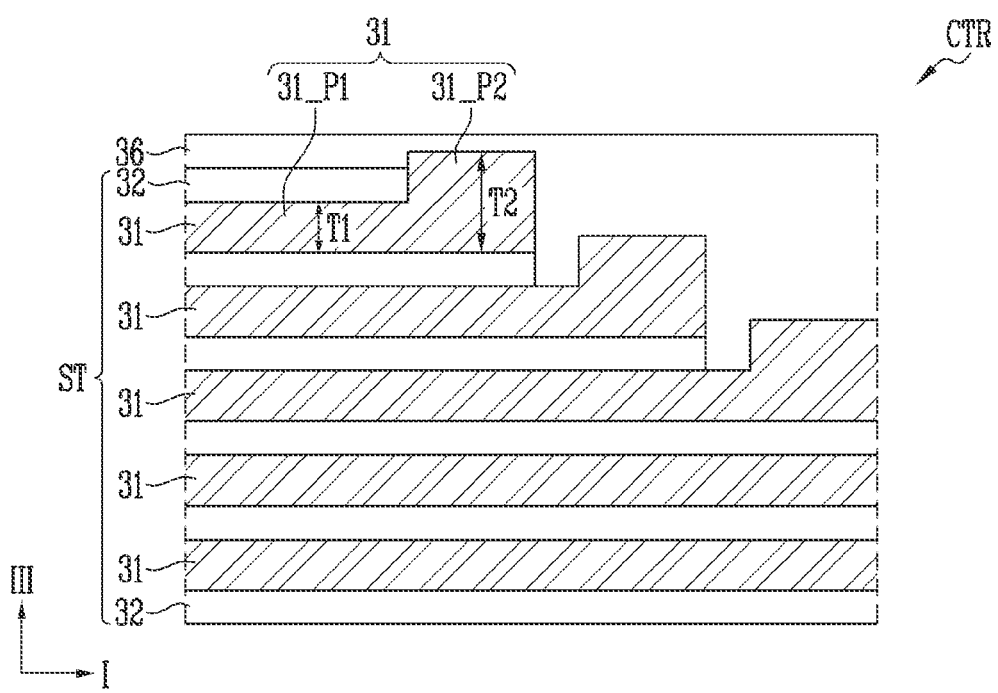

Referring to FIGS. 6A and 6B, a stack ST is formed. The stack ST may include sacrificial layers 31 and insulating layers 32 that are alternately stacked. The sacrificial layers 31 may include a material having a high etching selectivity with respect to the insulating layers 32. As an embodiment, the sacrificial layers 31 may include nitride and the insulating layers 32 may include oxide.

Subsequently, channel structures CH passing through the stack ST are formed. Each of the channel structures CH may include a channel layer 34. The channel structure CH may further include a memory layer 33 or an insulating core 35, or may further include a combination of the memory layer 33 and the insulating core 35.

Subsequently, the contact region CTR of the stack ST is patterned in a step shape. In an embodiment, after forming a mask pattern on the stack ST, an etching process using the mask pattern as an etching barrier and a mask pattern reduction process are alternately repeated. Through this, each of the sacrificial layers 31 may be exposed in the contact region CTR. In each of the sacrificial layers 31, a portion covered by an upper insulating layer 32 may be a first portion 31_P1, and an exposed portion may be a second portion 31_P2.

Subsequently, the sacrificial layers 31 may be processed so that the second portion 31_P2 has a thickness T2 thicker than a thickness T1 of the first portion 31_P1. As an embodiment, a sacrificial material may be additionally deposited on the second portion 31_P2 to selectively increase the thickness of the second portion 31_P2. The thickness T2 of the second portion 21_P2 may be selectively increased by conformally depositing the sacrificial material and then patterning the sacrificial material. Alternatively, the thickness T2 of the second portion 31_P2 may be selectively increased by selectively depositing the sacrificial material.

Subsequently, an interlayer insulating layer 36 is formed on the stack ST. The interlayer insulating layer 36 may include an insulating material such as oxide.

Figure 7A:
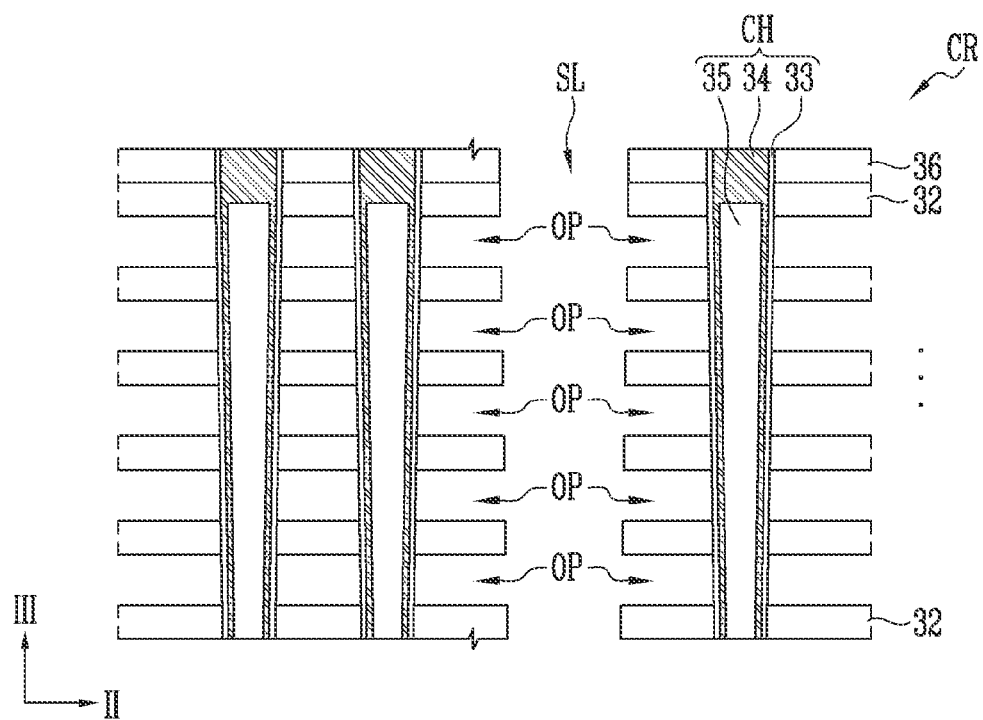
Figure 7B:
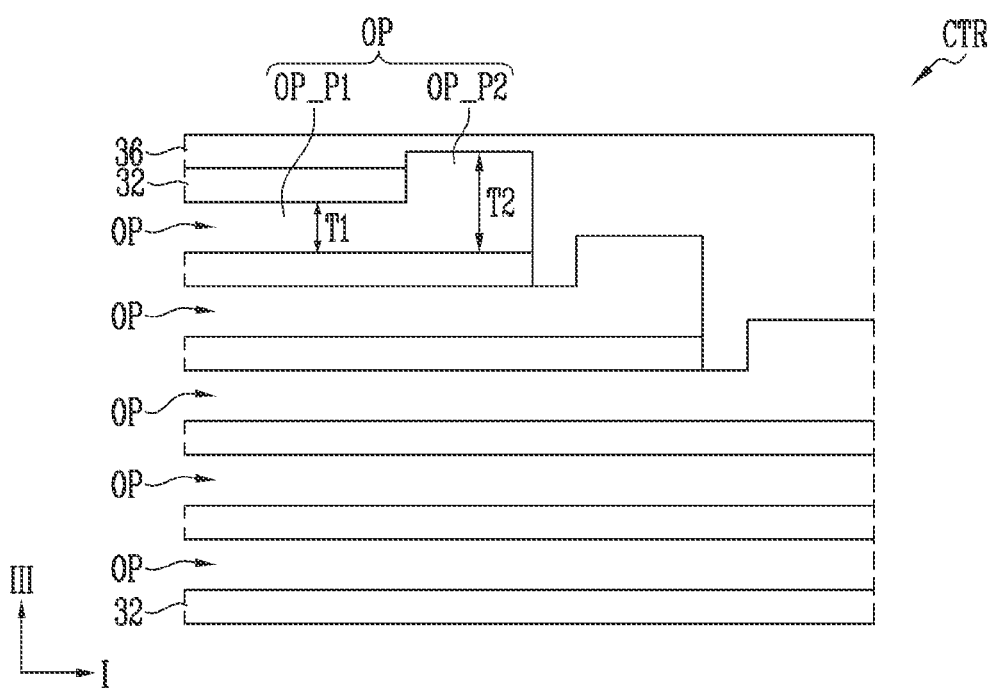

Referring to FIGS. 7A and 7B, a slit SL passing through the interlayer insulating layer 36 and the stack ST is formed. The slit SL may be positioned between the channel structures CH. The sacrificial layers 31 may be exposed by the slit SL.

Subsequently, the sacrificial layers 31 are etched through the slit SL to form openings OP. Each of the openings OP may include a first portion OP_P1 and a second portion OP_P2. A thickness T2 of the second portion OP_P2 may be thicker than a thickness T1 of the first portion OP_P1.

Figure 8A:
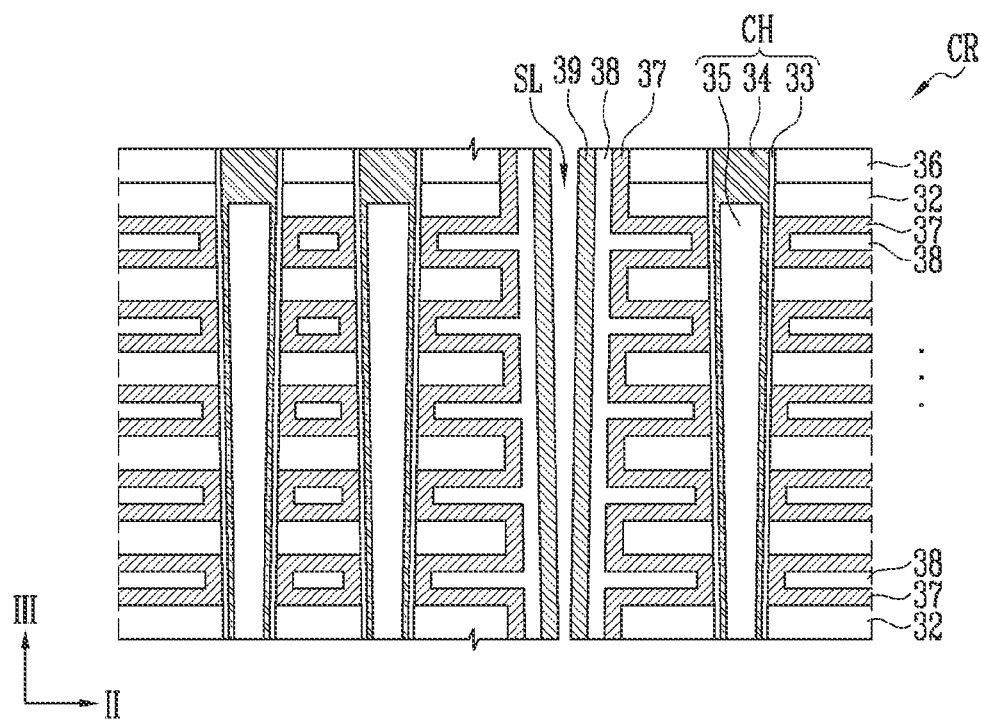
Figure 8B:
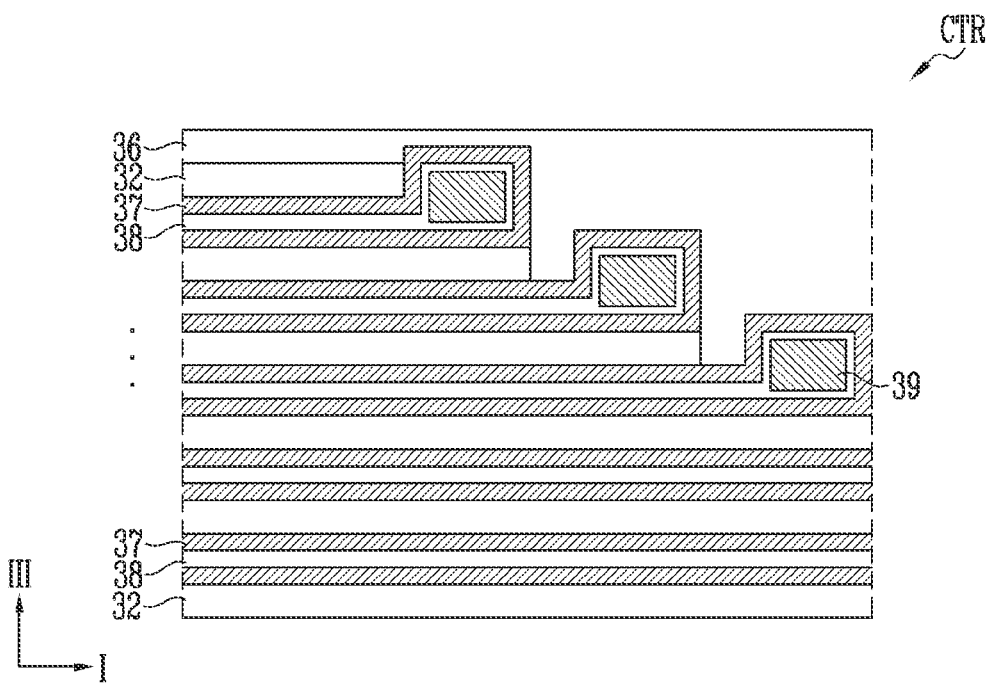

Referring to FIGS. 8A and 8B, a first metal layer 37 is formed in the openings OP and the slit SL. The first metal layer 37 may be formed in the first portion OP_P1 and the second portion OP_P2 of each of the openings OP. Subsequently, a first barrier layer 38 is formed in the openings OP and the slit SL. The first barrier layer 38 may be formed in the first metal layer 37. The first barrier layer 38 may be formed in the first portion OP_P1 and the second portion OP_P2 of each of the openings OP. The first portion OP_P1 may be completely or mostly filled by the first barrier layer 38. Subsequently, a second metal layer 39 is formed in the openings OP and the slit SL. The second metal layer 39 may be formed in the first barrier layer 38. The second metal layer 39 may be formed in the second portion OP_P2 of each of the openings OP. The first portion OP_P1 may be filled with the first metal layer 37 and the first barrier layer 38, and the second metal layer 39 might not be formed in the first portion OP_P1.

Here, the first metal layer 37 may include a first metal. The second metal layer 39 may include the first metal or a second metal different from the first metal. The first metal layer 37 and the second metal layer 39 may be formed using the same source gas or different source gases. As an embodiment, the first metal layer 37 may be formed using a chlorine-based source gas, and may include a molybdenum layer. The second metal layer 39 may be formed using a fluorine-based source gas, and may include a tungsten layer. Since the second metal layer 39 is formed only in the second portion OP_P2 of the opening OP, the fluorine-based source gas may be prevented or mitigated from being remained in the first portion OP_P1 even though the source gas remains in the second portion OP_2. Therefore, the channel structure CH may be prevented or minimized from being damaged due to the fluorine-based source gas remaining in the conductive layer CP.

A deposition speed of the first metal layer 37 may be slower than that of the second metal layer 39. Since the first metal layer 37, the first barrier layer 38, and the second metal layer 39 are combined to form the conductive layer CP, a deposition time may be reduced compared to a case where the opening OP is completely or mostly filled with the first metal layer 37.

The first barrier layer 38 may be formed in the entire first portion OP_P1 or may be formed only in one portion of the first portion OP_P1. As an embodiment, the first barrier layer 38 might not be formed between the channel structures CH. In this case, only the first metal layer 37 may be filled or a void may exist between the channel structures CH. The first barrier layer 38 may minimize or prevent the source gas of the second metal layer 39 from flowing into or remaining in the first metal layer 37 and damaging the peripheral layer such as the first metal layer 37. When only the first metal layer 37 is filled between the channel structures CH, the insulating layers 14 may be prevented or minimized from being structurally bent, by forming the first barrier layer 38. When the first metal layer 37 and the second metal layer 39 include different metals, the first barrier layer 38 may prevent a reaction between the first metal layer 37 and the second metal layer 39. As an embodiment, the first barrier layer 38 may include an insulating material such as nitride. As an embodiment, the first barrier layer 38 may include metal oxide, metal nitride, or metal oxynitride, or may include a combination thereof. Here, the metal included in the first barrier layer 38 may be the same as the first metal or the second metal, or may be the third metal different from the first metal and the second metal.

Figure 9A:
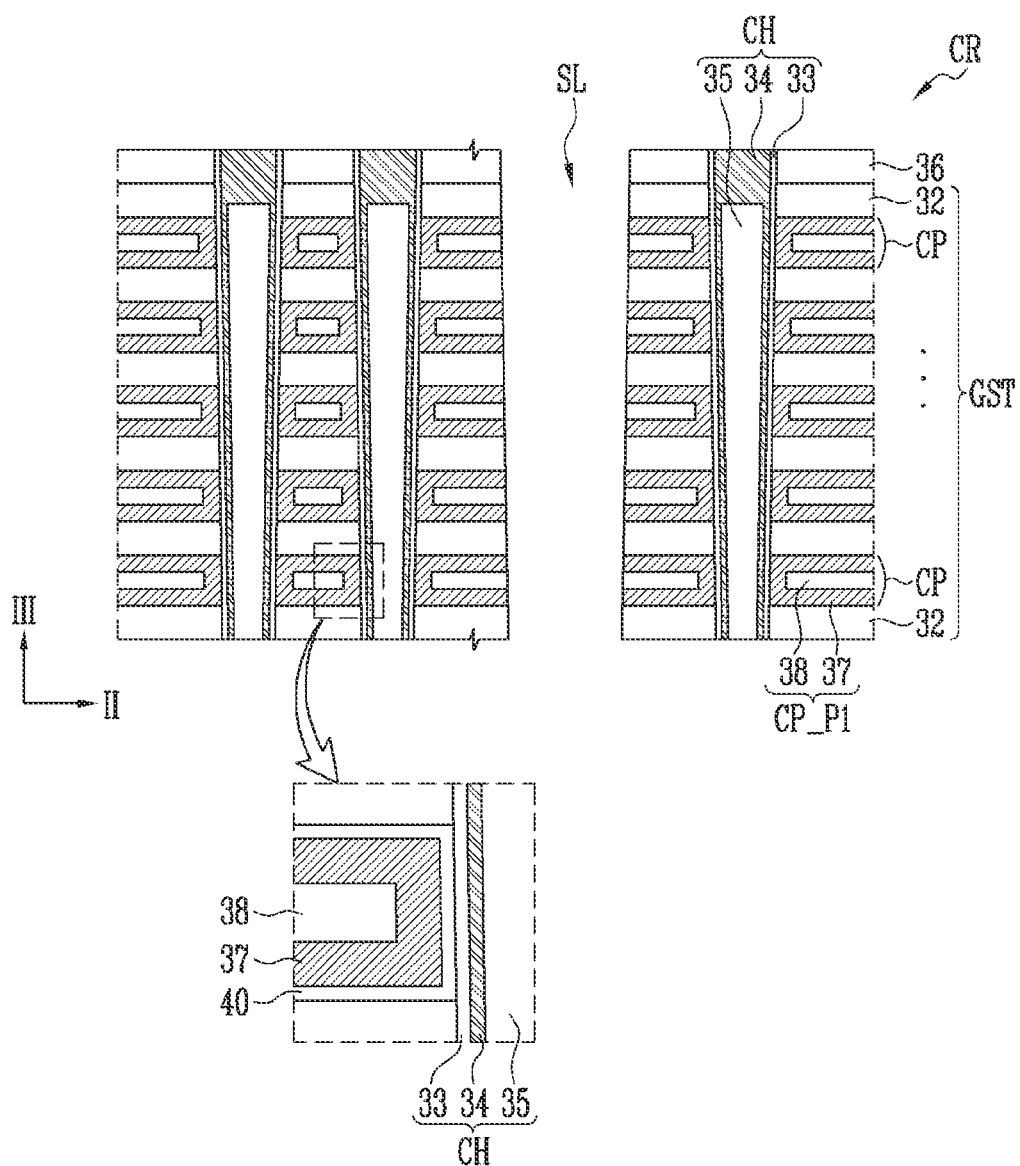
Figure 9B:
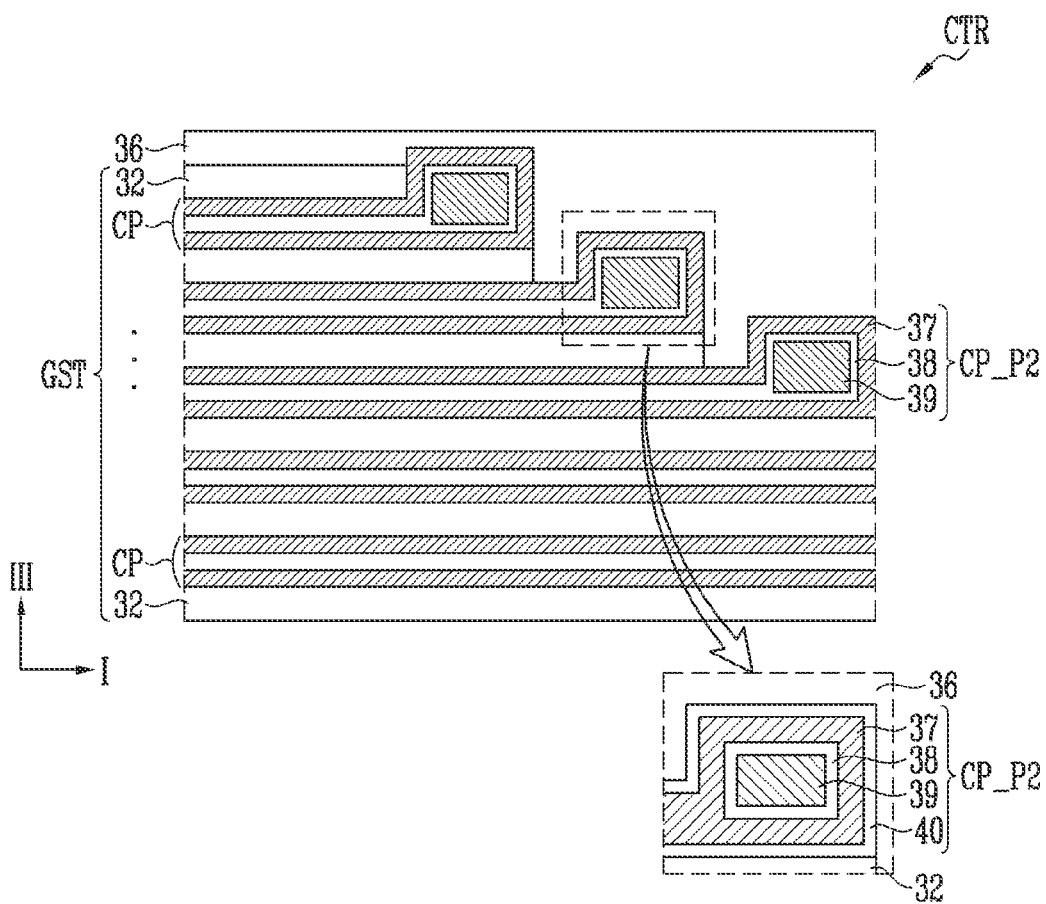

Referring to FIGS. 9A and 9B, conductive layers CP are formed. The conductive layers CP may be formed by etching a portion of the first metal layer 37, the first barrier layer 38, and the second metal layer 39 formed in the slit SL. The etching process may be performed by a wet etching method, a dry etching method, or a combination thereof. Each of the conductive layers CP may include the first metal layer 37, the second metal layer 39 in the first metal layer 37, and the first barrier layer 38 interposed between the first metal layer 37 and the second metal layer 39. Through this, a gate structure GST including the conductive layers CP and the insulating layers 32 that are alternately stacked is formed.

When the first metal layer 37 and the second metal layer 39 are etched by a wet etching process, an etching speed of the first metal layer 37 may be faster than that of the second metal layer 39. Therefore, the first metal layer 37 may be prevented or mitigated from being abnormally etched, by forming the second portion CP_P2 by combining the first metal layer 37, the first barrier layer 38, and the second metal layer 39. The first metal layer 37 may be prevented or mitigated from being etched abnormally quickly, by the first barrier layer 38 formed in the first metal layer 37.

For reference, before forming the first metal layer 37, the second barrier layer 40 may be formed. The second barrier layer 40 may include the same material as the first barrier layer 38 or may include a material different from that of the first barrier layer 38. As an embodiment, the second barrier layer 40 may include a metal oxide, a metal nitride, or a metal oxynitride, or may include a combination thereof. Here, the metal included in the second barrier layer 40 may be the same as the first metal or the second metal, or may be the third metal different from the first metal and the second metal.

Figure 10A:
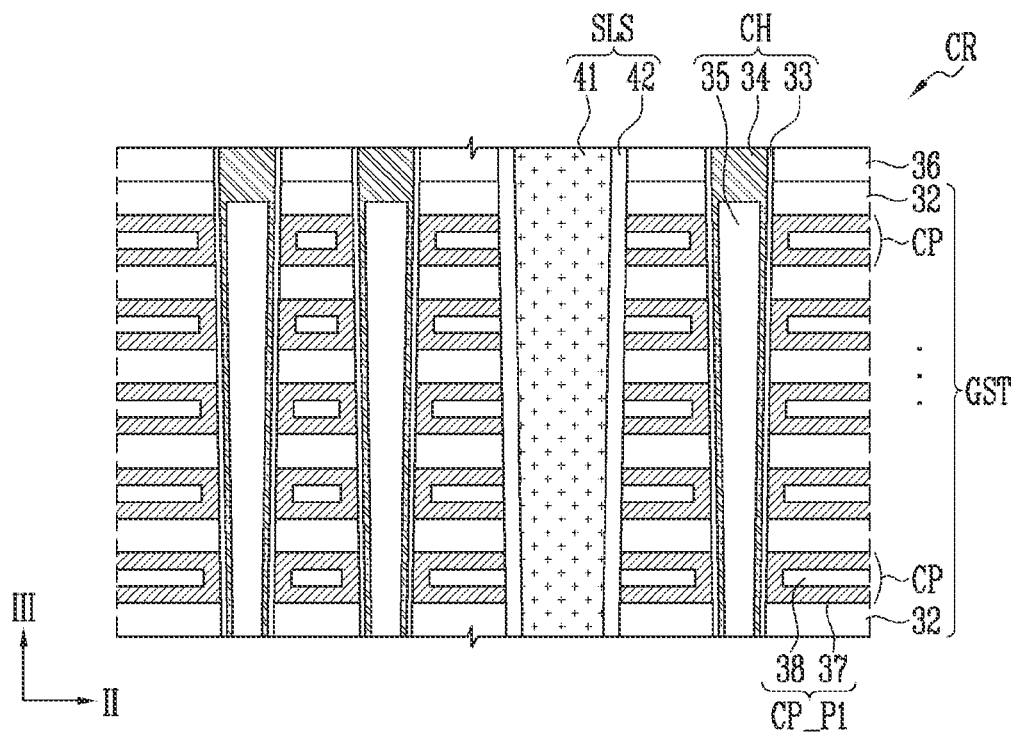
Figure 10B:
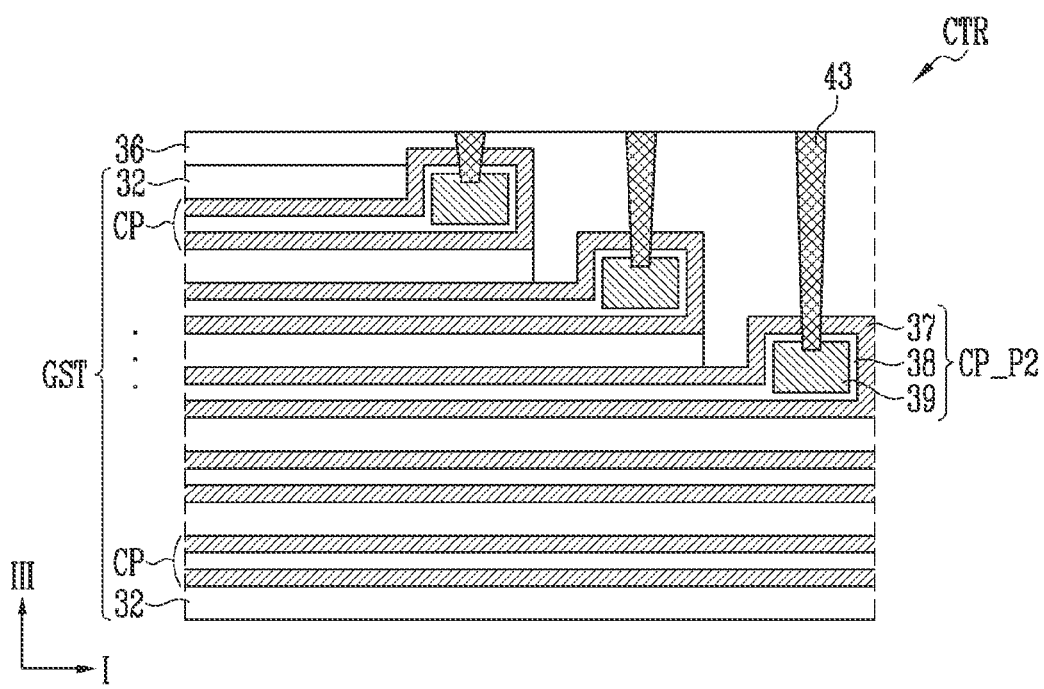

Referring to FIGS. 10A and 10B, a slit structure SLS is formed in the slit SL. As an embodiment, the slit structure SLS may include a source contact structure 41 and an insulating spacer 42 surrounding a sidewall of the source contact structure 41. As an embodiment, the slit structure SLS may include only an insulating material. The slit structure SLS might not include the source contact structure 41 and may include only the insulating spacer 42.

Subsequently, contact plugs 43 may be formed. The contact plug 43 may be electrically connected to the second portion CP_P2 of the conductive layer CP. The contact plug 43 may be electrically connected to at least one of the first metal layer 37, the first barrier layer 38, or the second metal layer 39. As an embodiment, contact holes passing through the interlayer insulating layer 36, the first metal layer 37, and the first barrier layer 38 and exposing the second metal layer 39 are formed. Subsequently, the contact plugs 43 are formed by filling conductive layers in the contact holes. Since an etching rate of the second metal layer 39 is lower than that of the first metal layer 37, the second metal layer 39 may be used as an etching stop layer when forming the contact holes.

According to the manufacturing method as described above, the conductive layer CP having partially different configurations may be formed. The channel structure CH may be prevented or minimized from being damaged, by excluding the second metal layer 39 using a fluorine-based source gas in the first portion CP_P1 adjacent to the channel structure CH. In the second portion CP_P2 to which the contact plug 43 is connected, the second metal layer 39 of which the etching rate is lower than that of the first metal layer 37 is formed, and thus an occurrence of a defect such as a punch may be prevented or minimized when the contact plug 43 is formed.

FIGS. 11A to 13A and 11B to 13B are diagrams illustrating a method of manufacturing a semiconductor device according to an embodiment of the present disclosure. FIG. A of each number may be a cross-sectional view of the cell region CR, and FIG. B of each number may be a cross-sectional view of the contact region CTR. Hereinafter, contents repetitive to the previously described contents are omitted.

Figure 11A:
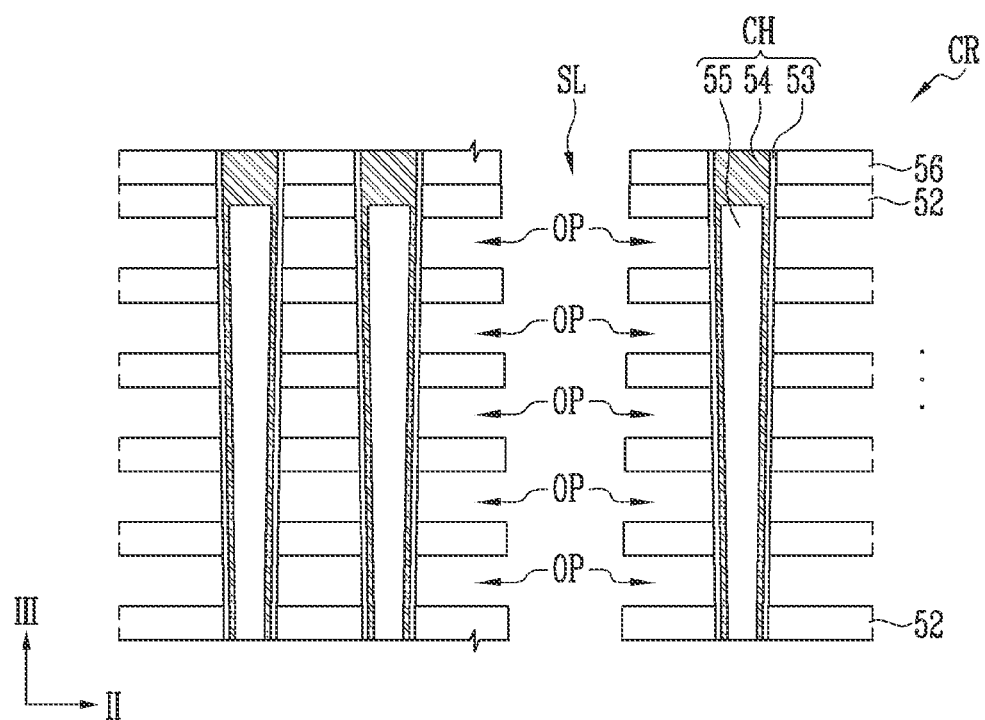
FIGS. 11A, 11B, 12A, 12B, 13A, and 13B are diagrams illustrating a method of manufacturing a semiconductor device according to an embodiment of the present disclosure.
Figure 11B:
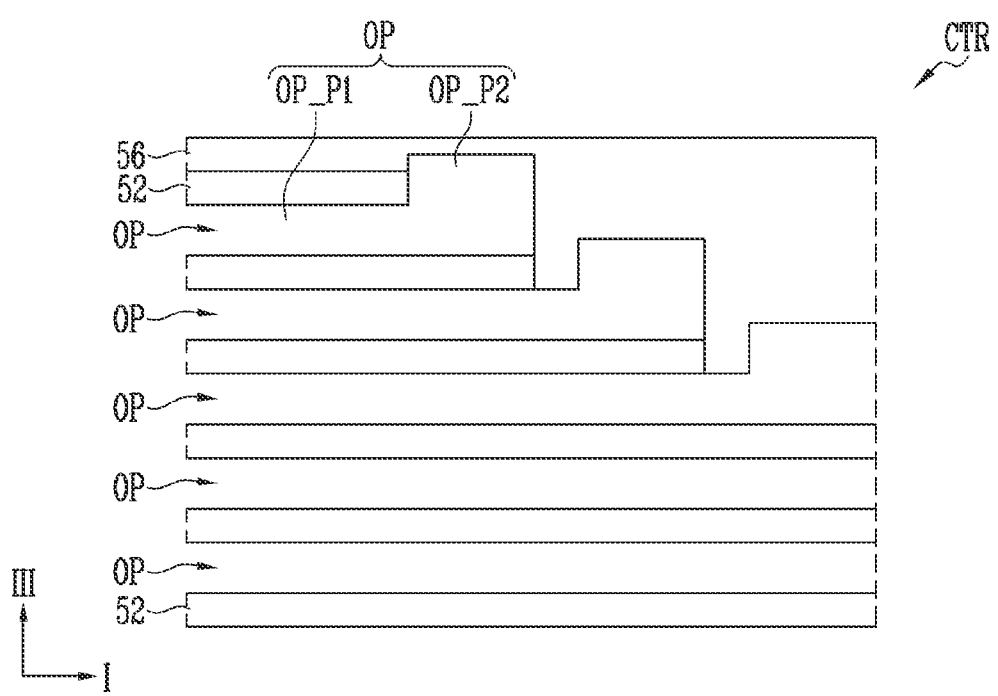

Referring to FIGS. 11A and 11B, a stack including sacrificial layers and insulating layers 52 alternately stacked is formed. Subsequently, channel structures CH passing through the stack are formed. Each of the channel structures CH may include a channel layer 54, may further include a memory layer 53 or an insulating core 55, or may further include a combination thereof. Subsequently, an interlayer insulating layer 56 is formed on the stack.

Subsequently, a slit SL passing through the interlayer insulating layer 56 and the stack are formed. Subsequently, the sacrificial layers are etched through the slit SL to form openings OP. Each of the openings OP may include a first portion OP_P1 and a second portion OP_P2.

Figure 12A:
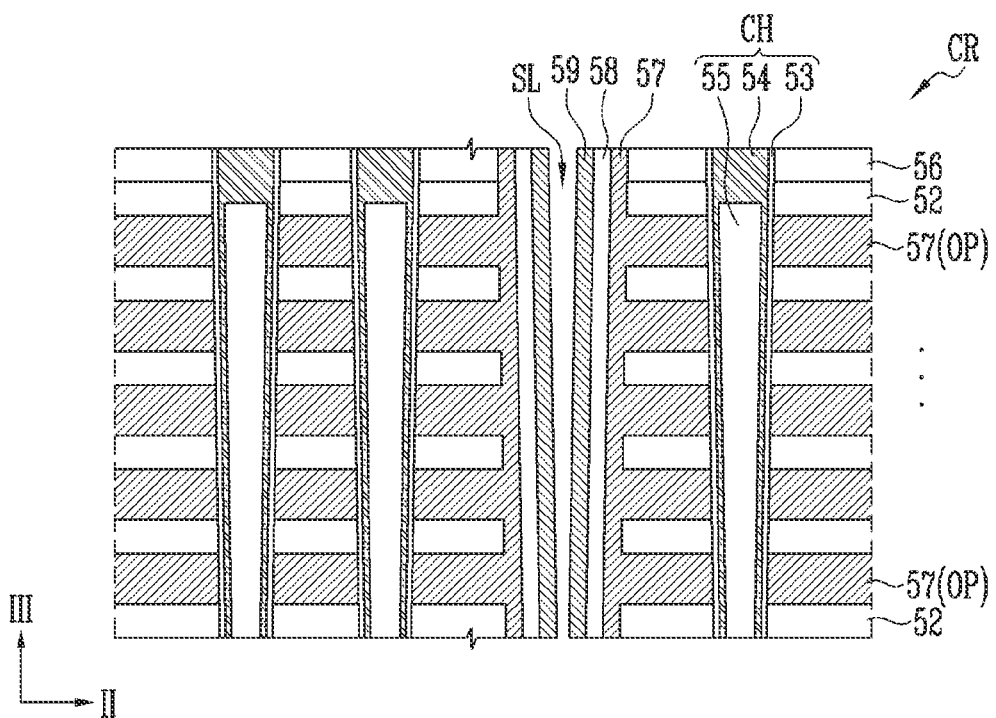
Figure 12B:
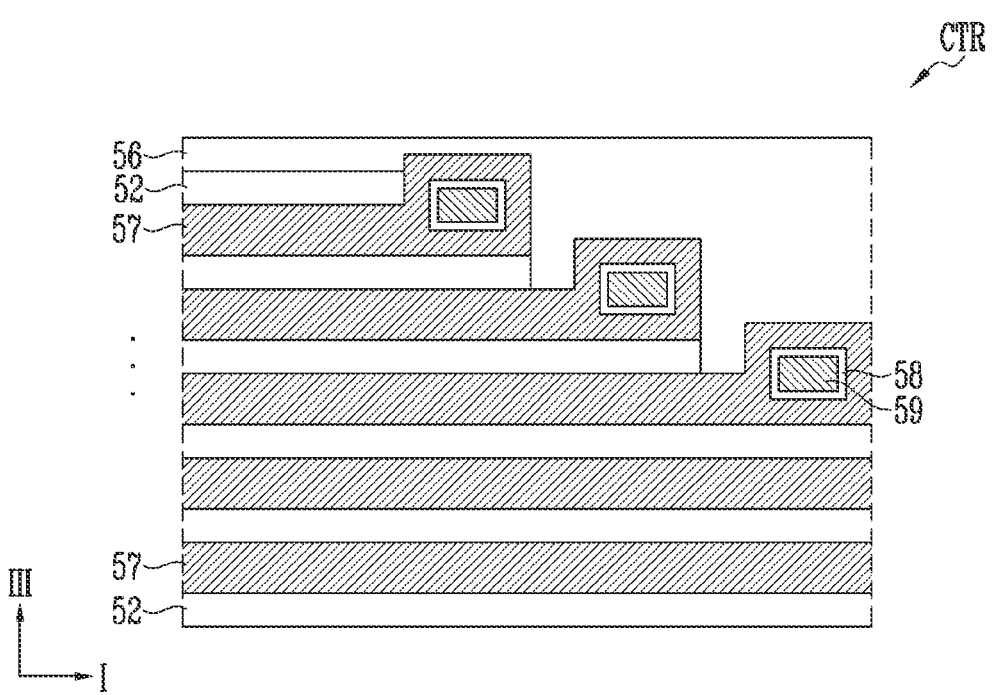

Referring to FIGS. 12A and 12B, a first metal layer 57 is formed in the openings OP and the slit SL. The first metal layer 57 may be formed in the first portion OP_P1 and the second portion OP_P2 of each of the openings OP. The first portion OP_P1 may be completely or mostly filled by the first metal layer 57. Subsequently, a first barrier layer 58 is formed in the openings OP and the slit SL. The first barrier layer 58 may be formed in the first metal layer 57. The first barrier layer 58 may be formed in the second portion OP_P2 of each of the openings OP. Subsequently, a second metal layer 59 is formed in the openings OP and the slit SL. The second metal layer 59 may be formed in the first barrier layer 58. The second metal layer 59 may be formed in the second portion OP_P2 of each of the openings OP. The first portion OP_P1 may be filled with the first metal layer 57, and the first barrier layer 58 and the second metal layer 59 might not be formed in the first portion OP_P1.

Figure 13A:
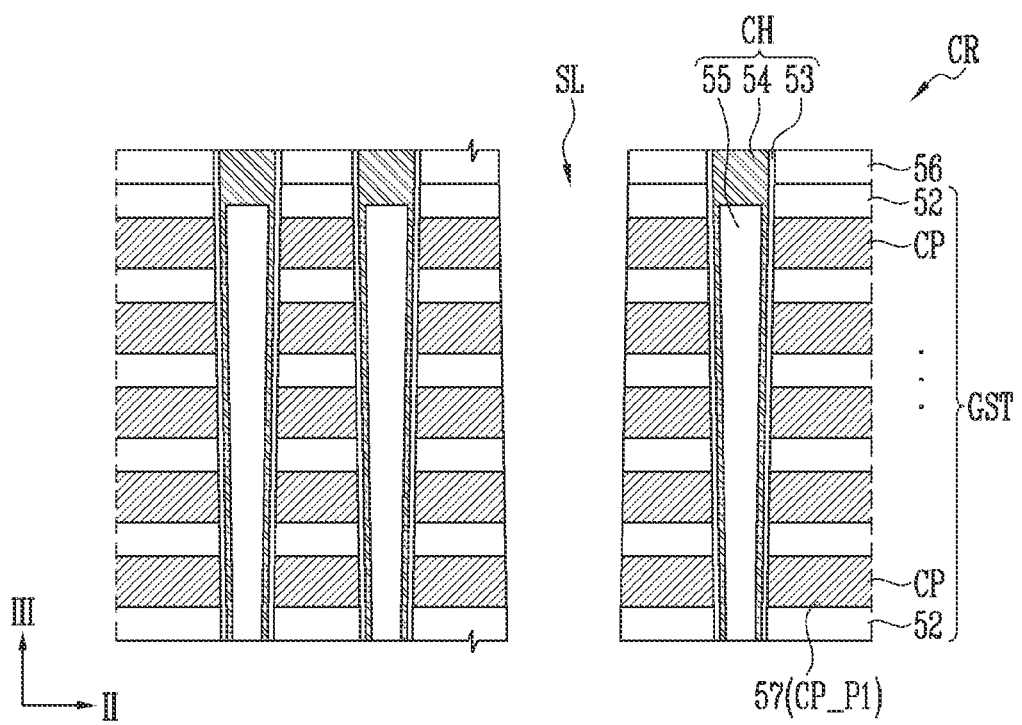
Figure 13B:
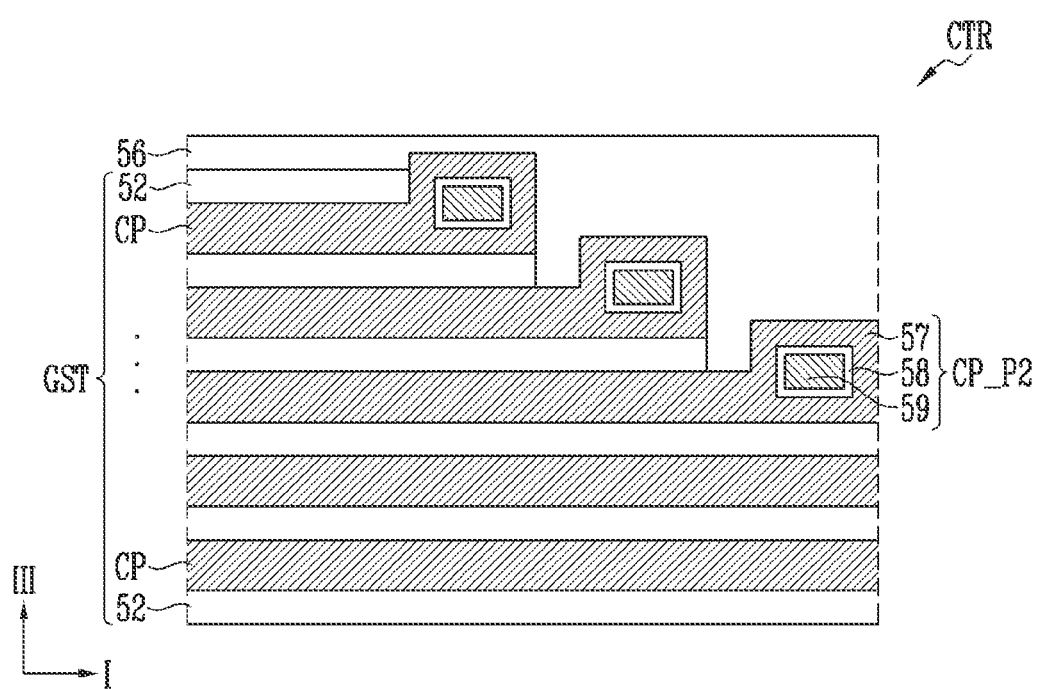

Referring to FIGS. 13A and 13B, conductive layers CP are formed. The conductive layers CP may be formed by etching a portion of the first metal layer 57, the first barrier layer 58, and the second metal layer 59 formed in the slit SL. Each of the conductive layers CP may include the first metal layer 57, the second metal layer 59 in the first metal layer 57, and the first barrier layer 58 interposed between the first metal layer 57 and the second metal layer 59. Through this, a gate structure GST including the conductive layers CP and the insulating layers 52 that are alternately stacked is formed.

For reference, the process described above may be partially changed. As an embodiment, the second portion OP_P2 may be filled by the first barrier layer 58, and a process of forming the second metal layer 59 may be omitted. In this case, each of the conductive layers CP may include the first metal layer 57 and the first barrier layer 58 in the first metal layer 57. As an embodiment, the second portion OP_P2 may be partially filled by the first barrier layer 58, and a gap fill layer may be formed in the first barrier layer 58 instead of the second metal layer 59. In this case, each of the conductive layers CP may include the first metal layer 57, the gap fill layer in the first metal layer 57, and the first barrier layer 58 interposed between the first metal layer 57 and the gap fill layer.

Subsequently, an additional process for forming a slit structure, contact plugs, and the like may be performed.

According to the manufacturing method as described above, the conductive layer CP having partially different configurations may be formed. The channel structure CH may be prevented or minimized from being damaged, by excluding the second metal layer 59 using a fluorine-based source gas in the first portion CP_P1 adjacent to the channel structure CH. In the second portion CP_P2 to which the contact plug is connected, the second metal layer 59 of which the etching rate is lower than that of the first metal layer 57 is formed, and thus an occurrence of a defect such as a punch may be prevented or minimized when the contact plug 43 is formed.

Figure 14:
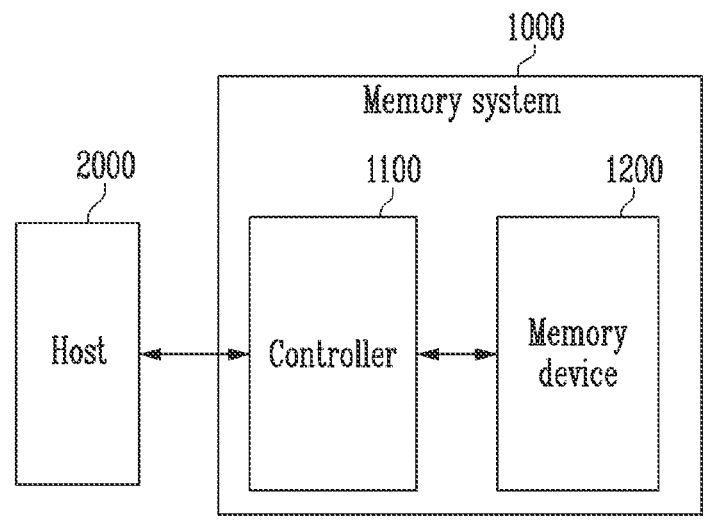
FIG. 14 is a diagram illustrating a memory system according to an embodiment of the present disclosure.

FIG. 14 is a diagram illustrating a memory system according to an embodiment of the present disclosure.

Referring to FIG. 14, the memory system 1000 may include a memory device 1200 in which data is stored, and a controller 1100 communicating between the memory device 1200 and a host 2000.

The host 2000 may be a device or system that stores data in the memory system 1000 or retrieves data from the memory system 1000. The host 2000 may generate requests for various operations and may output the generated requests to the memory system 1000. The requests may include a program request for a program operation, a read request for a read operation, an erase request for an erase operation, and the like. The host 2000 may communicate with the memory system 1000 through various interfaces such as peripheral component interconnect express PCIe), advanced technology attachment (ATA), serial ATA (SATA), parallel ATA (DATA), serial attached SCSI (SAS), nonvolatile memory express (NVMe), universal serial bus (USB), multi-media card (MMC), enhanced small disk interface (ESDI), or integrated drive electronics (IDE).

The host 2000 may include at least one of a computer, a portable digital device, a tablet, a digital camera, a digital audio player, a television, a wireless communication device, or a cellular phone, but embodiments of the present disclosure are not limited thereto.

The controller 1100 may generally control an operation of the memory system 1000. The controller 1100 may control the memory device 1200 according to the request of the host 2000. The controller 1100 may control the memory device 1200 so that the program operation, the read operation, the erase operation, and the like may be performed according to the request of the host 2000. Alternatively, the controller 1100 may perform a background operation or the like for improving performance of the memory system 1000 even though the request of the host 2000 does not exist.

The controller 1100 may transmit a control signal and a data signal to the memory device 1200 in order to control the operation of the memory device 1200. The control signal and the data signal may be transmitted to the memory device 1200 through different input/output lines. The data signal may include a command, an address, or data. The control signal may be used to divide a section in which the data signal is input.

The memory device 1200 may perform the program operation, the read operation, the erase operation, and the like under control of the controller 1100. The memory device 1200 may be implemented with a volatile memory device in which stored data is destroyed when power supply is cut off, or a nonvolatile memory device in which stored data is maintained even though power supply is cut off. The memory device 1200 may be the semiconductor device having the structure described above with reference to FIGS. 1A to 5E. The memory device 1200 may be the semiconductor device manufactured by the manufacturing method described above with reference to FIGS. 6A to 1B. As an embodiment, the semiconductor memory device may include a gate structure including alternately stacked conductive layers and insulating layers, channel structures passing through the gate structure, and contact plugs respectively connected to the conductive layers. Each of the conductive layers may include a first portion having a first thickness and a second portion having a second thickness thicker than the first thickness, and the second portion may include a first metal layer, a second metal layer in the first metal layer, and a first barrier layer interposed between the first metal layer and the second metal layer.

Figure 15:
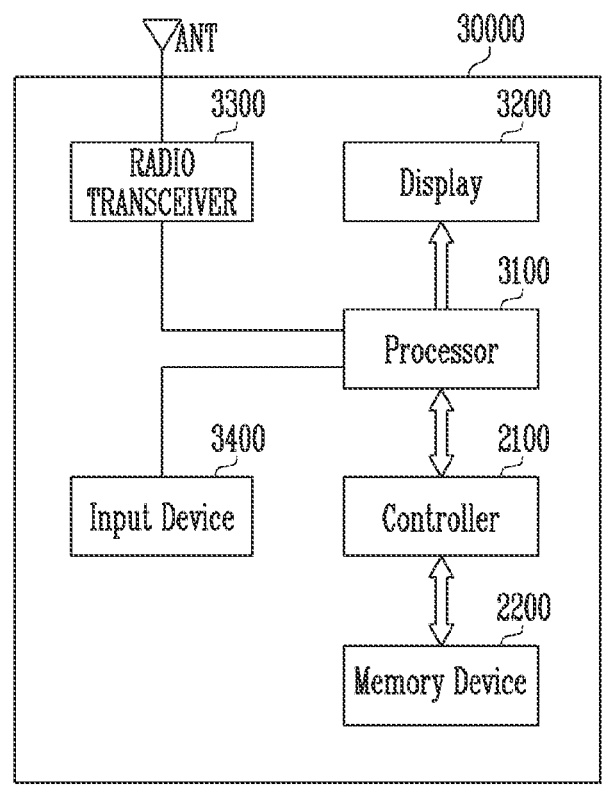
FIG. 15 is a diagram illustrating a memory system according to an embodiment of the present disclosure.

FIG. 15 is a diagram illustrating a memory system according to an embodiment of the present disclosure.

Referring to FIG. 15, the memory system 30000 may be implemented as a cellular phone, a smart phone, a tablet, a personal computer (PC), a personal digital assistant (PDA), or a wireless communication device. The memory system 30000 may include a memory device 2200 and a controller 2100 capable of controlling an operation of the memory device 2200.

The controller 2100 may control a data access operation, for example, a program operation, an erase operation, a read operation, or the like, of the memory device 2200 under control of a processor 3100.

Data programmed in the memory device 2200 may be output through a display 3200 under the control of the controller 2100.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 2100 or the display 3200. The controller 2100 may transmit the signal processed by the processor 3100 to the memory device 2200. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 2100, data output from the radio transceiver 3300, or data output from the input device 3400 is output through the display 3200.

According to an embodiment, the controller 2100 capable of controlling the operation of memory device 2200 may be implemented as a part of the processor 3100 and may be implemented as a chip separate from the processor 3100.

Figure 16:
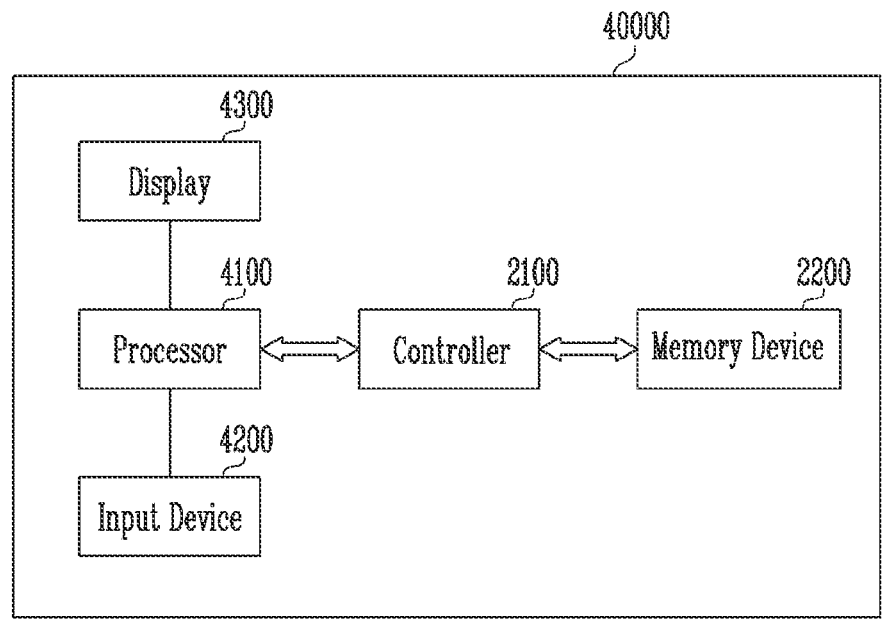
FIG. 16 is a diagram illustrating a memory system according to an embodiment of the present disclosure.

FIG. 16 is a diagram illustrating a memory system according to an embodiment of the present disclosure.

Referring to FIG. 16, the memory system 40000 may be implemented as a personal computer (PC), a tablet, a netbook, an e-reader, a personal digital assistant (PDA), a portable multimedia player (PMP), an MP3 player, or an MP4 player.

The memory system 40000 may include the memory device 2200 and the controller 2100 capable of controlling a data process operation of the memory device 2200.

A processor 4100 may output data stored in the memory device 2200 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 2100. According to an embodiment, the controller 2100 capable of controlling the operation of memory device 2200 may be implemented as a part of the processor 4100 or may be implemented as a chip separate from the processor 4100.

Figure 17:
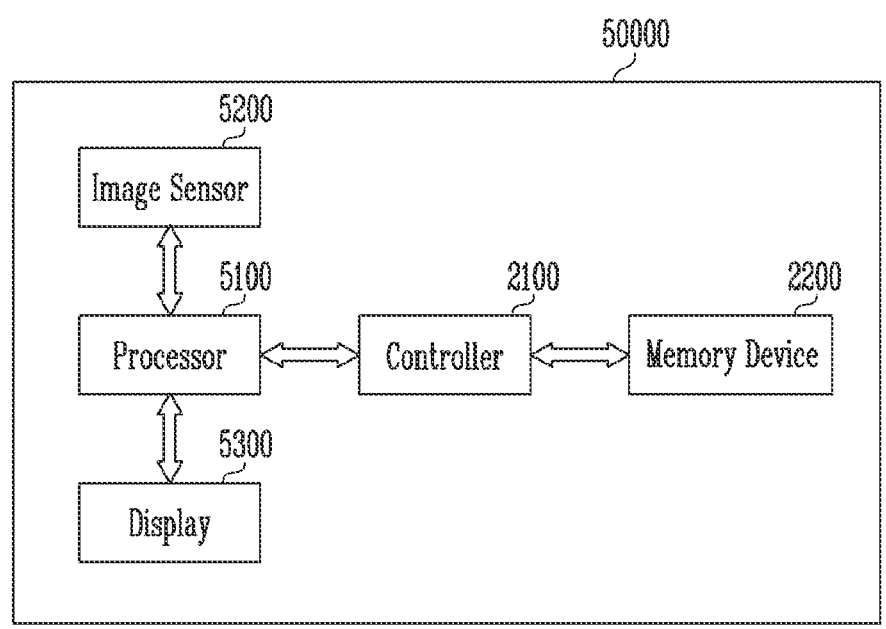
FIG. 17 is a diagram illustrating a memory system according to an embodiment of the present disclosure.

FIG. 17 is a diagram illustrating a memory system according to an embodiment of the present disclosure.

Referring to FIG. 17, the memory system 50000 may be implemented as an image processing device, for example, a digital camera, a portable phone provided with a digital camera, a smart phone provided with a digital camera, or a tablet provided with a digital camera.

The memory system 50000 includes the memory device 2200 and the controller 2100 capable of controlling a data process operation, for example, a program operation, an erase operation, or a read operation, of the memory device 2200.

An image sensor 5200 of the memory system 50000 may convert an optical image into digital signals. The converted digital signals may be transmitted to a processor 5100 or the controller 2100. Under control of the processor 5100, the converted digital signals may be output through a display 5300 or stored in the memory device 2200 through the controller 2100. In addition, data stored in the memory device 2200 may be output through the display 5300 under the control of the processor 5100 or the controller 2100.

According to an embodiment, the controller 2100 capable of controlling the operation of memory device 2200 may be implemented as a part of the processor 5100 or may be implemented as a chip separate from the processor 5100.

Figure 18:
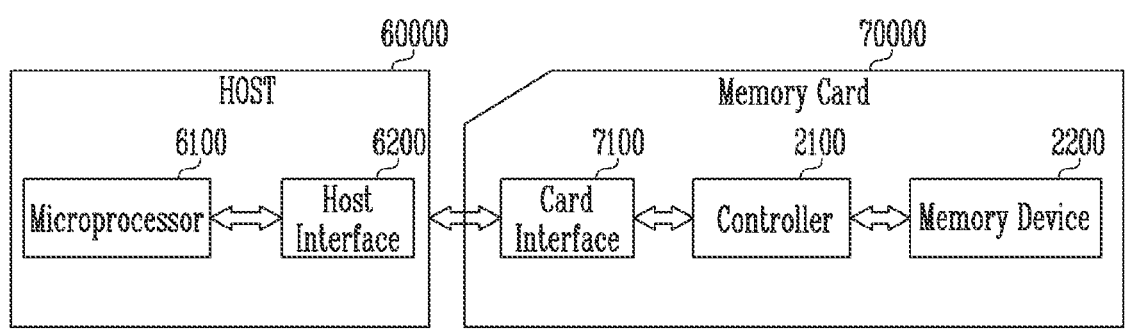
FIG. 18 is a diagram illustrating a memory system according to an embodiment of the present disclosure.

FIG. 18 is a diagram illustrating a memory system according to an embodiment of the present disclosure.

Referring to FIG. 18, the memory system 70000 may be implemented as a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be a secure digital (SD) card interface or a multi-media card (MMC) interface, but is not limited thereto.

The card interface 7100 may interface data exchange between a host 60000 and the controller 2100 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the controller 2100 under control of a microprocessor 6100.

What is claimed is:

1. A semiconductor device comprising:
   a gate structure including alternately stacked conductive layers and insulating layers;
   channel structures passing through the gate structure; and
   contact plugs respectively connected to the conductive layers,
   wherein each of the conductive layers includes a first portion having a first thickness and a second portion having a second thickness thicker than the first thickness,
   the second portion includes a first metal layer, a second metal layer in the first metal layer, the second metal layer being formed only in the second portion, and a first barrier layer interposed between the first metal layer and the second metal layer, and
   the first portion includes the first metal layer and the first barrier layer of which an upper portion and a lower portion are connected to the first metal layer.

2. The semiconductor device of claim 1, wherein the first metal layer includes molybdenum and the second metal layer includes tungsten.

3. The semiconductor device of claim 1, wherein the first barrier layer is configured to prevent a reaction between the first metal layer and the second metal layer.

4. The semiconductor device of claim 1, wherein the second metal layer includes a material having an etching rate lower than that of the first metal layer.

5. The semiconductor device of claim 1, wherein the first metal layer and the second metal layer include tungsten.

6. The semiconductor device of claim 1, wherein each of the contact plugs is electrically connected to at least one of the first metal layer, the first barrier layer, and the second metal layer.

7. The semiconductor device of claim 1, wherein the first portion includes the first metal layer, and the first barrier layer and the second metal layer are spaced apart from the first portion.

8. The semiconductor device of claim 1, wherein the first portion includes the first metal layer and the first barrier layer, and the second metal layer is spaced apart from the first portion.

9. The semiconductor device of claim 1, further comprising:
a second barrier layer surrounding the first metal layer.

10. The semiconductor device of claim 9, wherein the second barrier layer includes oxide, nitride, or oxynitride of a first metal included in the first metal layer, a second metal included in the second metal layer, or a third metal different from the first metal and the second metal.

11. The semiconductor device of claim 9, wherein each of the contact plugs is electrically connected to at least one of the second barrier layer, the first metal layer, the first barrier layer, and the second metal layer.

12. The semiconductor device of claim 1, wherein the conductive layers are stacked in a step shape.

13. A semiconductor device comprising:
a gate structure including alternately stacked conductive layers and insulating layers, the conductive layers being stacked in a step shape; and
channel structures passing through the gate structure,
wherein each of the conductive layers includes a first portion having a first thickness and a second portion having a second thickness thicker than the first thickness,
the second portion includes a first metal layer, a second metal layer in the first metal layer, the second metal layer being formed only in the second portion, and a first barrier layer interposed between the first metal layer and the second metal layer, and
the first portion includes the first metal layer and the first barrier layer of which an upper portion and a lower portion are connected to the first metal layer.

14. The semiconductor device of claim 13, wherein the first portion includes the first metal layer, and the first barrier layer and the second metal layer are spaced apart from the first portion.

15. The semiconductor device of claim 13, further comprising:
a second barrier layer surrounding the first metal layer.

* * * * *